(12) United States Patent
Takei et al.

(10) Patent No.: US 7,572,683 B2
(45) Date of Patent: Aug. 11, 2009

(54) SEMICONDUCTOR DEVICE, THE METHOD OF MANUFACTURING THE SAME, AND TWO-WAY SWITCHING DEVICE USING THE SEMICONDUCTOR DEVICES

(75) Inventors: Manabu Takei, Nagano (JP); Tatsuya Naito, Nagano (JP); Michio Nemoto, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 215 days.

(21) Appl. No.: 11/558,065

(22) Filed: Nov. 9, 2006

(65) Prior Publication Data
US 2007/0072359 A1    Mar. 29, 2007

Related U.S. Application Data

(62) Division of application No. 10/928,927, filed on Aug. 27, 2004, now Pat. No. 7,157,785.

(30) Foreign Application Priority Data
Aug. 29, 2003   (JP)   ............... 2003-209709

(51) Int. Cl.
*H01L 21/331* (2006.01)
(52) U.S. Cl. ............... 438/140; 257/E21.383
(58) Field of Classification Search ......... 438/335, 438/338, 342, 356, 140; 257/E21.383
See application file for complete search history.

(56) References Cited

U.S. PATENT DOCUMENTS

| 5,023,191 A | 6/1991 | Sakurai |
| 5,047,813 A | 9/1991 | Harada |
| 5,079,602 A | 1/1992 | Harada |
| 5,111,258 A | 5/1992 | Sasaki et al. |
| 5,200,632 A | 4/1993 | Sakurai |
| 5,273,917 A | 12/1993 | Sakurai |
| 5,321,281 A | 6/1994 | Yamaguchi et al. |
| 5,474,946 A * | 12/1995 | Ajit et al. .................. 438/138 |

(Continued)

FOREIGN PATENT DOCUMENTS

JP    2001-185727 A    7/2001

(Continued)

OTHER PUBLICATIONS

Takei et al.; "600 V-IGBT with Reverse Blocking Capability"; Proceedings of 2001 International Symposium on Power Semiconductor Devices & ICs, Osaka, Japan; vol. 11-1; pp. 413-416.

*Primary Examiner*—M. Wilczewski
*Assistant Examiner*—Toniae M Thomas
(74) *Attorney, Agent, or Firm*—Rossi, Kimms & McDowell LLP

(57) ABSTRACT

A semiconductor device is disclosed that reduces the reverse leakage current caused by reverse bias voltage application and reduces the on-voltage of the IGBT. A two-way switching device using the semiconductor devices is provided, and a method of manufacturing the semiconductor device is disclosed. The reverse blocking IGBT reduces the reverse leakage current and the on-voltage by bringing portions of an $n^-$-type drift region 1 that extend between p-type base regions and an emitter electrode into Schottky contact to form Schottky junctions.

2 Claims, 22 Drawing Sheets

U.S. PATENT DOCUMENTS

| | | |
|---|---|---|
| 5,485,022 A | 1/1996 | Matsuda |
| 5,525,816 A * | 6/1996 | Takahashi .................. 257/139 |
| 5,536,966 A | 7/1996 | Robinson et al. |
| 5,557,128 A | 9/1996 | Yamazaki et al. |
| 5,608,237 A | 3/1997 | Aizawa et al. |
| 5,698,454 A | 12/1997 | Zommer |
| 6,034,413 A | 3/2000 | Hastings et al. |
| 6,091,086 A | 7/2000 | Zommer |
| 6,218,709 B1 * | 4/2001 | Yasuda ...................... 257/378 |
| 6,737,722 B2 | 5/2004 | Yamamoto et al. |
| 6,825,565 B2 | 11/2004 | Onishi et al. |
| 6,838,321 B2 * | 1/2005 | Kaneda et al. .............. 438/133 |
| 7,009,239 B2 * | 3/2006 | Tokuda et al. .............. 257/302 |
| 2001/0000033 A1 | 3/2001 | Baliga |
| 2006/0137600 A1 | 6/2006 | Ellison et al. |

FOREIGN PATENT DOCUMENTS

| | | |
|---|---|---|
| JP | 2002-076017 A | 3/2002 |
| JP | 2002-319676 A | 10/2002 |
| JP | 2002-353454 A | 12/2002 |
| JP | 2003-017701 A | 1/2003 |

* cited by examiner h · · · Hole
e · · · Electron

Two-way Switching Device

Two-way Switching Circuit

A : $p^+$ n Junction  B : $p^-$ n Junction  C : Schottky Junction

SEMICONDUCTOR DEVICE, THE METHOD OF MANUFACTURING THE SAME, AND TWO-WAY SWITCHING DEVICE USING THE SEMICONDUCTOR DEVICES

CROSS REFERENCE TO RELATED APPLICATIONS

This application is a divisional of application Ser. No. 10/928,927, filed Aug. 27, 2004.

BACKGROUND OF THE INVENTION

A. Field of the Invention

The present invention relates to semiconductor devices such as power MOS devices used in electrical power converters. Specifically, the present invention relates to reverse blocking semiconductor devices exhibiting breakdown voltage characteristics (symmetrical or asymmetrical) including a forward breakdown voltage and a reverse breakdown voltage. The present invention relates also to the two-way switching devices using the reverse blocking semiconductor devices.

B. Description of the Related Art

VVVF inverters capable of varying the frequency and the voltage thereof are used very often to drive motors and such machines. Usually, the VVVF inverter includes a converter section, which converts an AC having a commercial frequency to a DC, and an inverter section, which converts the converted DC to an AC having a predetermined frequency and a predetermined voltage.

When it is desired to use the VVVF inverter as an electric power converter, it is necessary to provide the electric power converter with a converter section, an inverter section, a large inductor for smoothing the current, and a large capacitor for suppressing the voltage variations. Therefore, the size of an electric power converter necessarily is large. From the view point of obtaining a small and very efficient electric power converter, a matrix converter, which converters an AC not to a DC but directly to another AC, has been attracting increased attention.

FIG. 31(a) is a circuit diagram of a matrix converter. FIG. 31(b) is a diagram of a two-way switch circuit including conventional two-way switching devices. To configure this matrix converter, two-way switching devices, which can switch at a high frequency, are indispensable. When a reverse blocking IGBT (insulated gate bipolar transistor) is not available, a two-way switching device is manufactured by connecting a series circuit consisting of a conventional IGBT 51 and a diode 53 for reverse blocking and a series circuit consisting of a conventional IGBT 52 and a diode 54 for reverse blocking in opposite parallel.

However, the on-voltage of the two-way switching device, which is the sum of the on-voltages of the diodes 53, 54 and the IGBT's 51, 52, is inevitably high. Therefore, for obtaining a two-way switching device exhibiting high performance, a reverse blocking IGBT exhibiting high performances is indispensable.

FIG. 32(a) is a top plan view of a conventional reverse blocking IGBT. FIG. 32(b) is a cross sectional view of the conventional reverse blocking IGBT along the line segment X-X of FIG. 32(a). Referring now to these figures, the conventional reverse blocking IGBT includes an $n^-$-type drift region 1 as a semiconductor substrate 100. Cells are in the surface portion of $n^-$-type drift region 1. Each cell includes a p-type base region 3. In the surface portion of p-type base region 3, $n^+$-type emitter regions 6 and 6 are formed. A gate electrode 8 is above the extended portion of p-type base region 3 that extends between $n^+$-type emitter region 6 and $n^-$-type drift region 1, with a gate insulation film 7 interposed between gate electrode 8 and the extended portion of p-type base region 3. An emitter electrode 10 is in contact with p-type base regions 3 and $n^+$-type emitter regions 6 through holes 12. An interlayer insulation film 9 insulates gate electrode 8 and emitter electrode 10 from each other. A $p^+$-type collector region 15 is on the back surface of $n^-$-type drift region 1. A p-type separation region 2 is in contact with $p^+$-type collector region 15 and the side faces of $n^-$-type drift region 1. A collector electrode 16 is on $p^+$-type collector region 15. In the reverse blocking IGBT of FIGS. 32(a) and 32(b), the surface portion of $n^-$-type drift region 1 between the adjacent cells is covered with gate insulation film 7 and isolated electrically from emitter electrode 10.

Japanese Unexamined Laid Open Patent Application 2003-17701 discloses intentional utilization of the parasitic diode in a trench MOSFET for a free wheel diode. In the trench gate MOSFET, each cell includes a base region sandwiched between the trenches and isolated from the base regions in the other cells such that a drift region is exposed. A Schottky junction is formed between the exposed portion of the drift region and a part of the emitter electrode. A high current is made to flow through the Schottky diode including the Schottky junction such that the Schottky diode is utilized for a free wheel diode. The on-voltage of the Schottky diode is lower than the on-voltage of the diode including a pn-junction between the base region and the drift region thereof, since the threshold voltage (Schottky barrier) of the Schottky junction is lower than the threshold voltage (built-in voltage) of the pn-diode. Thus, down-sizing of the semiconductor device is realized by forming a Schottky junction on the exposed portion of the drift region. This structure is applied also to an IGBT.

Japanese Unexamined Laid Open Patent Application 2002-76017 reports utilization of a reverse blocking IGBT as a diode. In the utilization, a positive gate voltage is applied to open channels such that the collector of the reverse blocking IGBT is used for the anode of the diode and the emitter of the reverse blocking IGBT for the cathode of the diode. This document describes reduction of the peak reverse recovery current in the reverse blocking IGBT used in the diode mode by introducing a lifetime killer to the drift region for obtaining soft recovery characteristics.

Japanese Unexamined Laid Open Patent Application 2002-319676 describes lowering of the on-voltage in the IGBT mode of operation, reduction of the reverse recovery current in the diode mode of operation, and realization of soft recovery characteristics in the diode mode of operation by reducing the thickness of the collector region of a reverse blocking IGBT down to around 1 μam.

Japanese Unexamined Laid Open Patent Application 2001-185727 describes a reverse blocking IGBT provided with a positive bevel structure for obtaining a certain forward breakdown voltage and a certain reverse breakdown voltage.

FIG. 33 is a cross sectional view of a conventional reverse blocking IGBT describing the biased state thereof. When a reverse bias voltage is applied between the emitter and the collector, the electrons generated in the depletion layer are injected into p-type base regions 3 working as channels, and into a p-type region 4 in the periphery of the active region. Holes are injected from emitter regions 6 such that the electrons injected into p-type base regions 3 are neutralized. The number of the electrons generated in the depletion layer keeps increasing. When a reverse bias voltage is applied to a reverse blocking IGBT, a depletion layer expands from the back surface side. Therefore, the number of electrons generated in the depletion layer expanding from the back surface side increases. Due to the increase of electrons in the depletion layer, a large reverse leakage current flows when a reverse bias voltage is applied (in the reverse blocking state).

The reasons why the number of the electrons generated in the depletion layer increases and the reverse leakage current increases are as follows. First, defects are left in $p^+$-type collector region 15 formed in the back surface portion of the reverse blocking IGBT by low temperature annealing. When a reverse bias voltage is applied, a depletion layer expands from the pn-junction in the back surface portion of the IGBT into $p^+$-type collector region 15. In other words, a high-electric-field region is created in $p^+$-type collector region 15. Since $p^+$-type collector region 15 is formed by annealing at a low temperature between 300 and 500°, crystal defects are left in $p^+$-type collector region 15. The time for which carriers are generated through the defects (the carrier generation lifetime) is very short. In other words, carriers are generated very frequently. The carriers generated in $p^+$-type collector region 15 are made to migrate by the electric field, causing a leakage current.

Second, the generated carriers described above (electrons) are amplified by parasitic transistors in the IGBT. The parasitic transistors include a pnp-transistor formed of p-type base region 3, $n^-$-type drift region 1, and $p^+$-type collector region 15, and a pnp-transistor formed of p-type regions 4 and 5, $n^-$-type drift region 1, and $p^+$-type collector region 15. In the forward blocking state of the IGBT, p-type region 4 is not effective to reduce the forward leakage current. In the turning off of the IGBT, p-type region 4 extracts the holes accumulated in $n^-$-type drift region 1, resulting in an excellent turning off performance of the IGBT.

The p-type diffusion regions in the surface portion of the IGBT, such as p-type base regions 3, p-type region 4 and p-type region 5, are doped heavily to secure an appropriate MOS threshold voltage and to avoid latching up. In the surface portions of these p-type diffusion regions, the dopant concentration is higher than $1 \times 10^{19}$ cm$^{-3}$. Due to the high surface dopant concentration, the emitter injection efficiencies (the efficiencies of injection from the p-type diffusion regions to the n-type drift region across the pn-junctions between the p-type diffusion regions and the n-type drift region) of the parasitic pnp-transistors are extremely high and the amplification factors thereof are large. Due to the large amplification factors, the electron current generated in the back surface portion of the IGBT is amplified, causing a high leakage current.

In a conventional reverse blocking IGBT, the emitter and the $n^-$-type drift region (that is the bases of the parasitic transistors) are connected electrically to each other via MOS channels when a positive bias voltage is applied between the gate and the emitter thereof. Therefore, the electrons generated in the back surface portion of the conventional reverse blocking IGBT flow to the emitter electrode through the channels without entering the p-type diffusion regions in the surface portion of the IGBT. Thus, the electron current is not amplified and the reverse leakage current is reduced dramatically. However, it is very complicated and difficult for the circuit, to which the matrix converter as shown in FIG. 31(a) is applied, to detect the reverse blocking IGBT biased at a reverse bias potential and to apply a positive voltage to the gate thereof.

The above described problem may be avoided by setting the voltage between the gate and the emitter at 0 V to bias the reverse blocking IGBT at a reverse bias potential. When the voltage between the gate and the emitter of the reverse blocking IGBT is set at 0 V to bias the IGBT at a reverse bias potential, a depletion layer expands from the pn-junction between $p^+$-type collector region 15 in the back surface portion of the IGBT and $n^-$-type drift region 1 into $n^-$-type drift region 1 and toward p-type base regions 3. During this process, electrons flow into p-type base regions 3 from a region, in which charge neutrality is retained (hereinafter referred to as a "charge-neutrality region"), left undepleted in $n^-$-type drift region 1 on the side of p-type base regions 3. In response to this, holes flow into $n^-$-type drift region 1 from p-type base regions 3, making the pnp transistor work.

Since a heavily doped $p^+$-type region is formed in p-type base region 3, a very high emitter injection efficiency of 0.8 or higher is caused in a conventional reverse blocking IGBT, further causing a high current amplification factor α pnp. Due to the high current amplification factor, an extremely high leakage current of 10 mA/cm$^2$ or higher is caused at a high temperature of 100° or higher when the reverse blocking IGBT is biased at a reverse bias potential.

Transport efficiency can be reduced in order to reduce the amplification factor of the parasitic bipolar transistor. The transport efficiency is reduced by shortening the recombination lifetime in $n^-$-type drift region 1, for example, by introducing crystal defects by electron beam irradiation and similar methods. As the amplification factor is reduced, the leakage current is also reduced. However, since the crystal defects introduced shorten the carrier generation lifetime, a large forward leakage current is caused. When the dose amount of electron beam is too large, a higher steady state on-voltage is caused, causing additional large losses.

As described in Japanese Unexamined Laid Open Patent Application 2003-17701, a Schottky junction is formed in a MOSFET to use the Schottky diode for a free wheel diode. This makes it unnecessary to additionally mount an individual free wheel diode by using the Schottky diode for a free wheel diode, and chip size is reduced. This document also intends to reduce loses by using the Schottky diode for a free wheel diode. Therefore, the Schottky junction is formed in the entire exposed surface area of the drift region. Formation of the Schottky junction in the entire exposed surface area of the drift region in the MOSFET is preferable to reduce the on-voltage of the Schottky diode used for the free wheel diode.

Although the embodiment of an IGBT which utilizes a Schottky diode for a free wheel diode is described in Japanese Unexamined Laid Open Patent Application 2003-17701, the effects thereof are not described. The simulations conducted by the present inventors have revealed that an electron accumulation layer will not be formed in the surface portion of the drift region if a Schottky junction is formed in the entire exposed surface area of the drift region in the IGBT. Therefore, electron concentration in the surface portion of the drift region is lowered, the electrical resistance of the drift region is increased, and the on-voltage of the IGBT is increased.

In view of the foregoing, it is a first object of the invention to obviate the problems described above. It is a second object of the invention to provide a semiconductor device that facilitates reducing the leakage current caused by reverse bias voltage application and reducing the on-voltage of the IGBT. It is a third object of the invention to provide the method of manufacturing the semiconductor device. It is a fourth object of the invention to provide the two-way switching device using the semiconductor devices.

SUMMARY OF THE INVENTION

In view of the foregoing, it is an object of the invention to obviate the problems described above.

It is a further object of the invention to provide a semiconductor device that facilitates reducing the leakage current caused by reverse bias voltage application and reducing the on-voltage of the IGBT.

It is another object of the invention to provide the method of manufacturing the semiconductor device.

It is also an object of the invention to provide the two-way switching device using the semiconductor devices.

According to a first aspect of the invention, a semiconductor device is provided that includes a semiconductor substrate; a drift region of a first conductivity type in the semiconductor substrate; base regions of a second conductivity type formed selectively in the surface portion of the drift region; one or more emitter regions of the first conductivity type in the surface portion of each of the base regions; a gate electrode facing to a part of each of the base regions and a part of the one or more emitter regions across a gate insulation film interposed therebetween; an emitter electrode in contact with the base regions and the emitter regions; a collector region of the second conductivity type on the back surface of the drift region; a separation region of the second conductivity type in contact with the side faces of the collector region and the side faces of the drift region; and a collector electrode on the collector region. The emitter electrode and the extended portions of the drift region extending between the base regions are in contact with each other to form Schottky junctions.

In one embodiment, the semiconductor device further includes a second semiconductor region of the second conductivity type in the surface portion of the drift region, the second semiconductor region surrounding the base regions, and the second semiconductor region being in contact with the peripheral portion of the emitter electrode. Preferably, the Schottky junctions are distributed, and the barrier height of the metal, of which the emitter electrode forming the Schottky junctions is made, is between 0.5 eV and 1.1 eV.

According to a second aspect of the invention, a semiconductor device includes a semiconductor substrate; a drift region of a first conductivity type in the semiconductor substrate; base regions of a second conductivity type formed selectively in the surface portion of the drift region; one or more emitter regions of the first conductivity type in the surface portion of each of the base regions; a gate electrode facing to a part of each of the base regions and a part of the one or more emitter regions across a gate insulation film interposed therebetween; an emitter electrode in contact with the base regions and the emitter regions; a collector region of the second conductivity type on the back surface of the drift region; a separation region of the second conductivity type in contact with the side faces of the collector region and the side faces of the drift region; a collector electrode on the collector region; and first semiconductor regions of the second conductivity type in the extended portions of the drift region extending between the base regions. The first semiconductor regions and the emitter electrode are in contact with each other.

Advantageously, the semiconductor device further includes a second semiconductor region of the second conductivity type in the surface portion of the drift region, the second semiconductor region surrounding the base regions, and the second semiconductor region being in contact with the peripheral portion of the emitter electrode. Preferably, the first semiconductor regions are distributed. It is preferred that the integral impurity concentration per a unit area in the first semiconductor region is lower than the integral impurity concentration per a unit area in the base region, and that the base region is deeper than the first semiconductor region. In a preferred embodiment, the semiconductor device further includes first buffer regions of the first conductivity type in the drift region, the first buffer regions surrounding the respective base regions. In another variation, the semiconductor device further includes a second buffer region of the first conductivity type in the drift region, the second buffer region being in contact with the collector region.

A third aspect of the invention provides a method of manufacturing the semiconductor device including a semiconductor substrate, an n-type drift region in the semiconductor substrate, p-type base regions formed selectively in the surface portion of the drift region, one or more n-type emitter regions in the surface portion of each of the base regions, a gate electrode facing to a part of each of the base regions and a part of the one or more emitter regions across a gate insulation film interposed therebetween, an emitter electrode in contact with the base regions and the emitter regions, a p-type collector region on the back surface of the drift region, a p-type separation region in contact with the side faces of the collector region and the side faces of the drift region, and a collector electrode on the collector region. The method includes the steps of extending the drift region between the base regions; implanting boron ions at a dose amount between $1\times10^{11}$ cm$^{-2}$ and $1\times10^{14}$ cm$^{-2}$ into the extended portions of the drift region to form first p-type semiconductor regions such that the first p-type semiconductor regions are distributed; and making the first p-type semiconductor regions and the emitter electrode contact each other.

A fourth aspect of the invention is a method of manufacturing the semiconductor device including a semiconductor substrate, an n-type drift region in the semiconductor substrate, p-type base regions formed selectively in the surface portion of the drift region, one or more n-type emitter regions in the surface portion of each of the base regions, a gate electrode facing to a part of each of the base regions and a part of the one or more emitter regions across a gate insulation film interposed therebetween, an emitter electrode in contact with the base regions and the emitter regions, second p-type semiconductor regions in the surface portion of the drift region, the second p-type semiconductor regions being shaped as respective islands arranged like a ring surrounding the base regions, a p-type collector region on the back surface of the drift region, a p-type separation region in contact with the side faces of the collector region and the side faces of the drift region, and a collector electrode on the collector region. The method includes the steps of extending the drift region between the base regions; implanting boron ions at a dose amount between $1\times10^{11}$ cm$^{-2}$ and $1\times10^{14}$ cm$^{-2}$ into the extended portions of the drift region that extend between the base regions to form first p-type semiconductor regions and into the extended portions of the drift region that extend between the island-shaped second p-type semiconductor regions to form third p-type semiconductor regions; making the first p-type semiconductor regions and the emitter electrode contact each other; and making the second p-type semiconductor regions and the third p-type semiconductor regions contact the peripheral portion of the emitter electrode simultaneously with making the first p-type semiconductor regions and the emitter electrode contact each other. Advantageously, the heat treatment for forming the first p-type semiconductor regions is conducted at 550° or lower.

According to a fifth aspect of the invention, a two-way semiconductor switching device includes a pair of any of the semiconductor devices as described above, with the pair of semiconductor device being connected in opposite parallel such that the two-way semiconductor switching device exhibits two-way electrical conduction.

BRIEF DESCRIPTION OF THE DRAWINGS

The foregoing advantages and features of the invention will become apparent upon reference to the following detailed description and the accompanying drawings.

DETAILED DESCRIPTION OF SPECIFIC EMBODIMENTS

Figure 34:
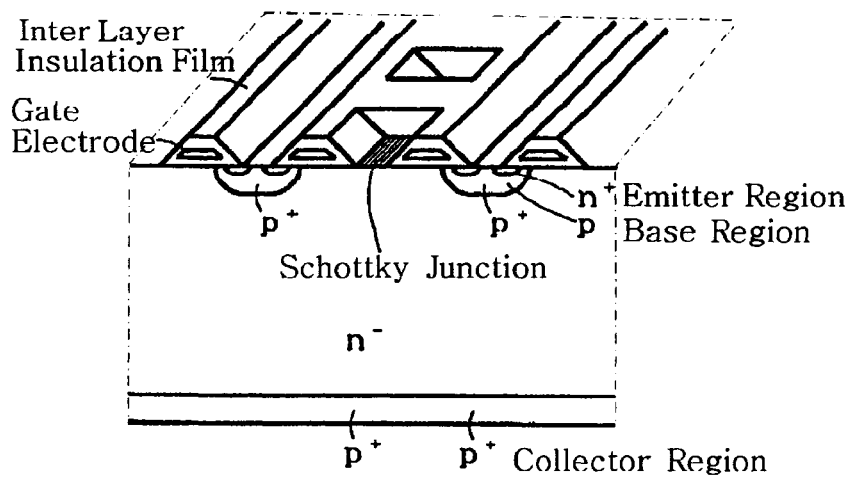
FIG. 34 is a perspective view showing the surface of a reverse blocking IGBT, in which an $n^-$-type silicon region and an emitter electrode are in Schottky contact with each other.

As shown in FIG. 34, an $n^-$-type silicon region and an emitter electrode are in Schottky contact with each other in the surface of a reverse blocking IGBT. Although the pn-junction in the back surface portion is biased in reverse when a reverse bias voltage is applied to the reverse blocking IGBT, the pn-junctions (or the Schottky junctions) in the upper surface portion are biased in forward. As described in FIG. 35, a current can be made to flow through the Schottky junction at a forward bias voltage lower than the forward bias voltage at which the same current is made to flow in the low current range through the pn-junction of a $p^+$-type diffusion region (e.g., a p-type base region). Therefore, the electron current caused in the back surface flows not into the $p^+$-type diffusion regions but into the Schottky junctions, the amplification effects of the pn-junction vanish and the leakage current is reduced dramatically. Although a current flows through the pn-junction when the electron current is in the order of several tens A/cm² or higher, the pn-junction will not be ON in the leakage current range of several mA/cm².

Figure 35:
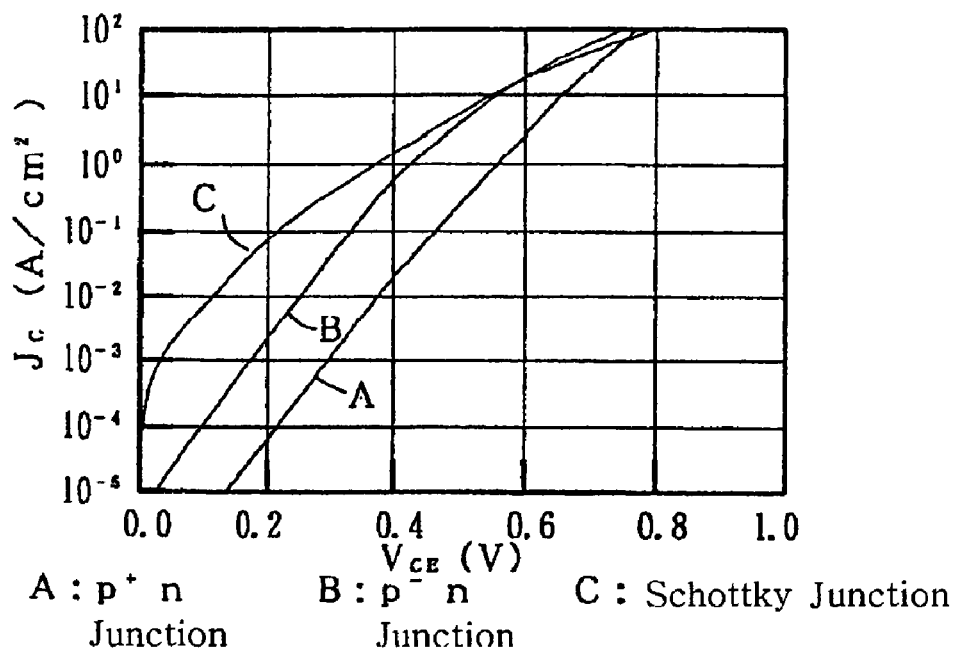
FIG. 35 is graph relating the on-voltage ($J_{CE}$) and the current density ($J_C$) with each other.
Figure 36:
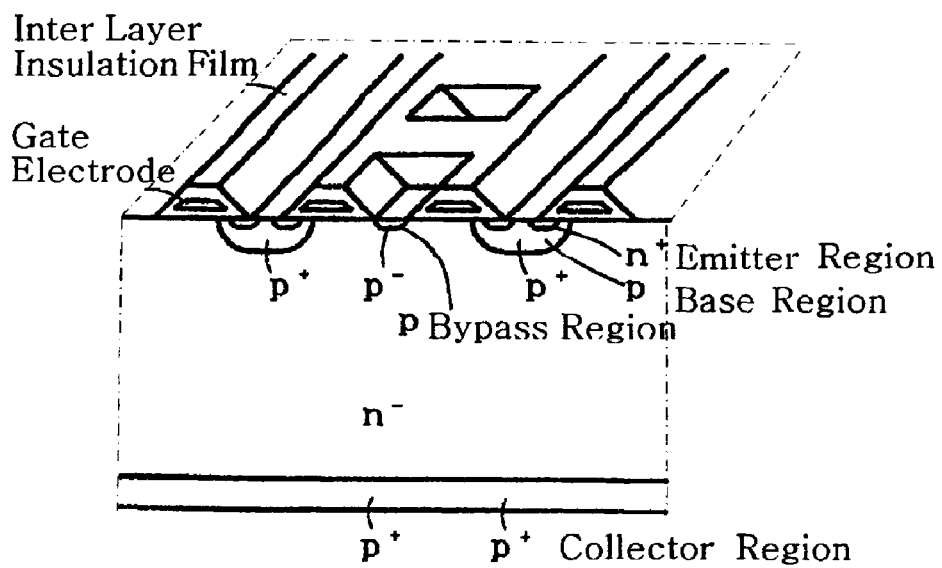
FIG. 36 is a perspective view showing the surface of a reverse blocking IGBT, in which p-type bypass regions are formed in substitution for the Schottky junction in FIG. 34.

A lightly doped p-type region may be substituted for the Schottky junction as described in FIG. 36. As described in FIG. 35, it is easier to make a current flow in the low current range when the p-type region in the pn-diode is doped lightly. Therefore, although the surface pn-junction is biased at a forward bias potential when a reverse bias voltage is applied to the reverse blocking IGBT, a current flows only through the pn-junction of the lightly doped p-type region in the low current range (the bypass effects of the electrons). Therefore, the amplification factor is determined by the lightly doped p-type region (hereinafter referred to as the "p-type bypass region"), and hole injection is suppressed. Due to this, the leakage current reduces drastically.

Figure 37:
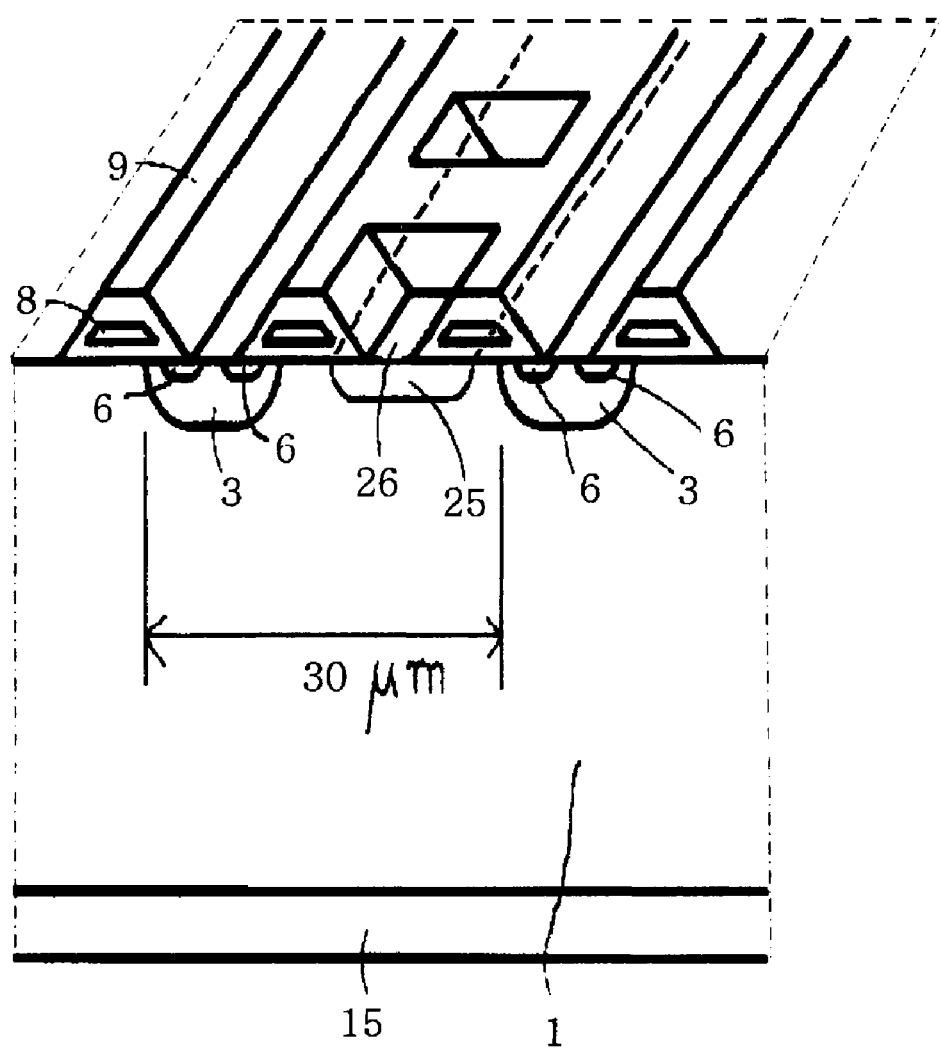
FIGS. 37 and 38 are additional perspective views showing the surfaces of reverse blocking IGBTs in which p-type bypass regions are formed.
Figure 38:
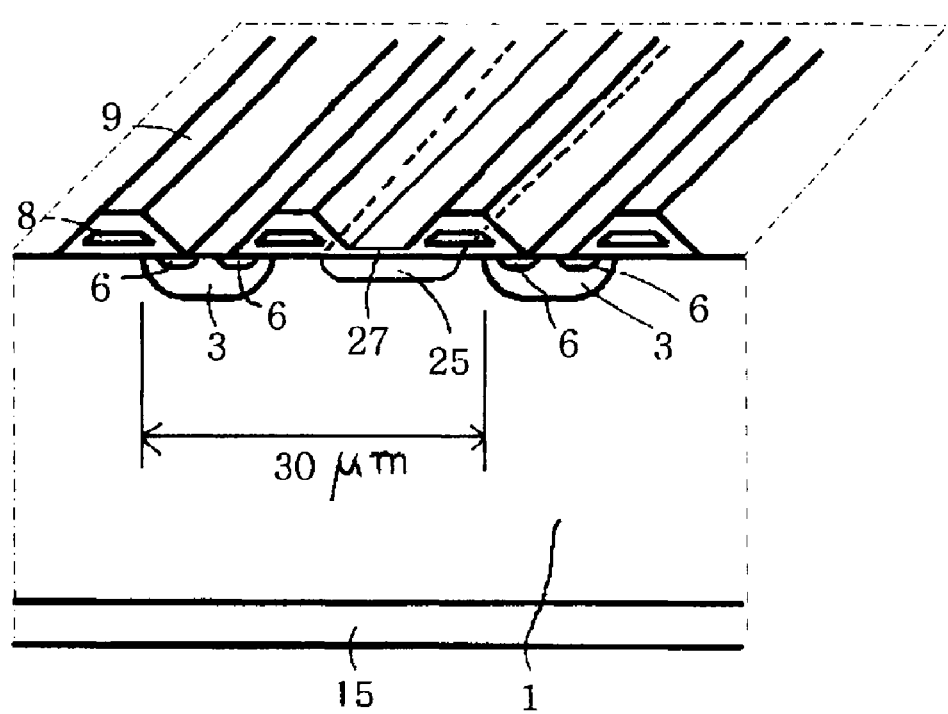

Due to a lightly doped p-type region in FIG. 36, the leakage current reduces drastically but the on-voltage increases. FIG. 37 and FIG. 38 are shown as embodiments in which the leakage current is reduced and at the same time any increase in the on-voltage is suppressed.

FIG. 37 shows lightly doped p-type region ("p-type bypass region") 25 and contact region 26. Lightly doped p-type region 25 has a stripe shape like p-type base region 3 and extends in the same direction as the p-type base regions. Contact region 26 is formed dispersively in portions of lightly doped p-type region 25 of a stripe shape. In FIG. 37, the pitch of a cell is indicated as 30 µm, a space between contact regions 26 is 300 µm and a width in the stripe direction of contact region 26 is 10 µm. Contact region 26 has the size of 2 µm×10 µm. When a reverse bias voltage is applied to a reverse blocking IGBT, an electron current raised in the back surface does not flow through a pn-junction of a cell of IGBT comprising p-type base region 3, but flows instead through a pn-junction of lightly doped p-type region 25. Then the effect of amplification due to a pnp structure reduces and the leakage current reduces.

In FIG. 38, contact region 27 contacts lightly doped p-type region 25 and has a stripe shape of the width of 2 µm such that a contact resistance is high and the region contacting with each other is large. A thin oxide film is formed on contact region 27 as a means of making contact resistance high. At the same time, contact resistance of a contact boundary between contact region 27 and an emitter electrode is formed higher than that of a contact boundary between p-type base region 3 of a cell region of IGBT and an emitter electrode. Due to these relationships among the contact resistances, a high resistance exists when current flows into lightly doped p-type region 25. In FIG. 37, an electron current flows through lightly doped p-type region 25 because contact region 26 is formed dispersively in places in a direction of a stripe shape of lightly doped p-type region 25. But in FIG. 38, an electron current does not flow places in a direction of a stripe shape of lightly doped p-type region 25 because contact region 27 contacts lightly doped p-type region 25 in a stripe shape, and compared with FIG. 37 the increase of the amplification factor can be suppressed and the reverse leakage current can be reduced. When the increase of amplification factor is intentionally suppressed in FIG. 37 as well as FIG. 38, for example, the width and length of contact region 26 may be respectively 2 µm, a pitch between contact regions 26 may be 2 µm and an area of each of contact regions can be small and the space between contact regions 26 can be small.

Now the invention will be described in detail hereinafter with reference to the accompanied drawing figures which illustrate the preferred embodiments of the invention.

According to a first aspect of the invention, extended portions of the drift region extend between the base regions (between the cells) and the emitter electrode and are in contact such that Schottky junctions are formed. According to a second aspect of the invention, p-type bypass regions formed in the surface portions of the extended portions of the drift region that extend between the base regions and the emitter electrode are in contact with each other. By adopting any of the structures described above, the leakage current and the on-voltage are reduced.

Figure 1A:
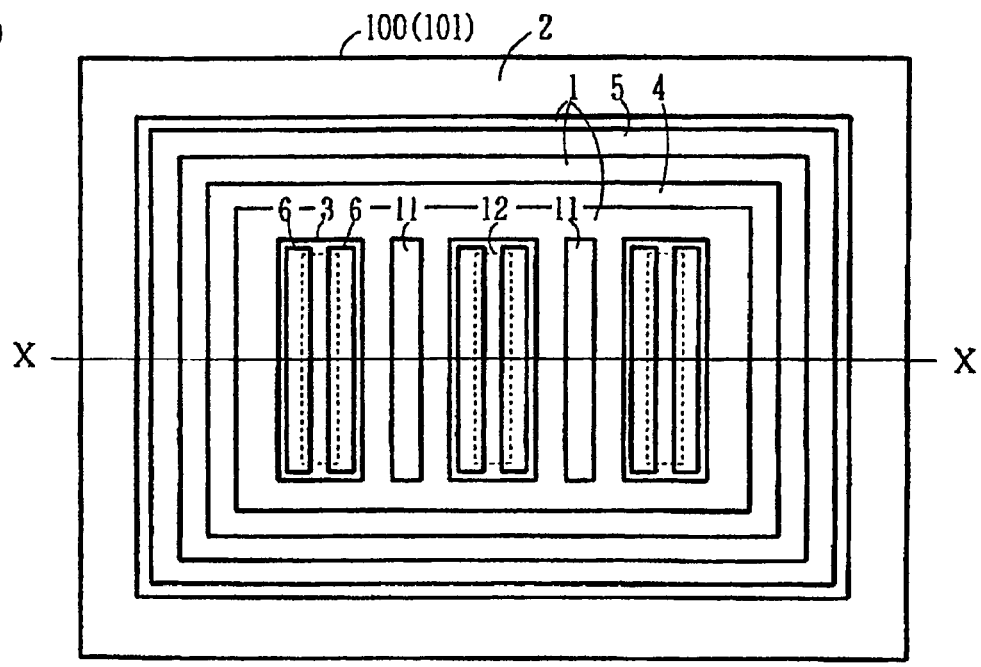
FIG. 1(a) is a top plan view of a semiconductor device according to a first embodiment of the invention.
Figure 1B:
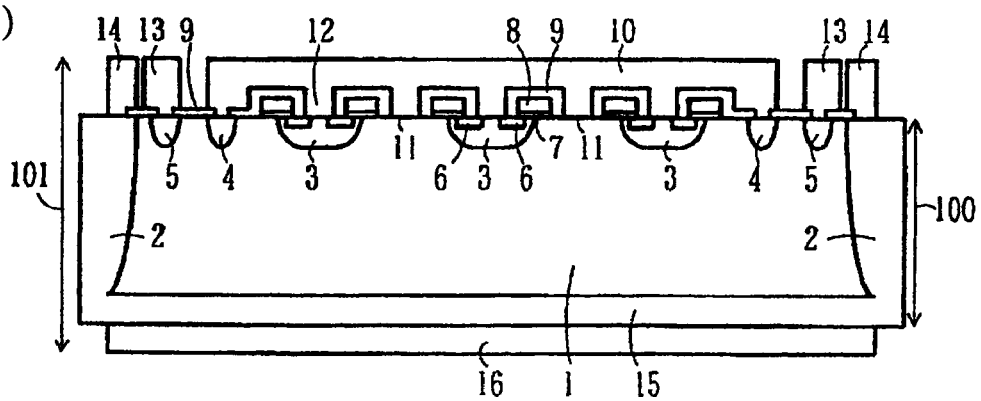
FIG. 1(b) is a cross sectional view of the semiconductor device according to the first embodiment along the line segment X-X of FIG. 1(a).
Figure 32A:
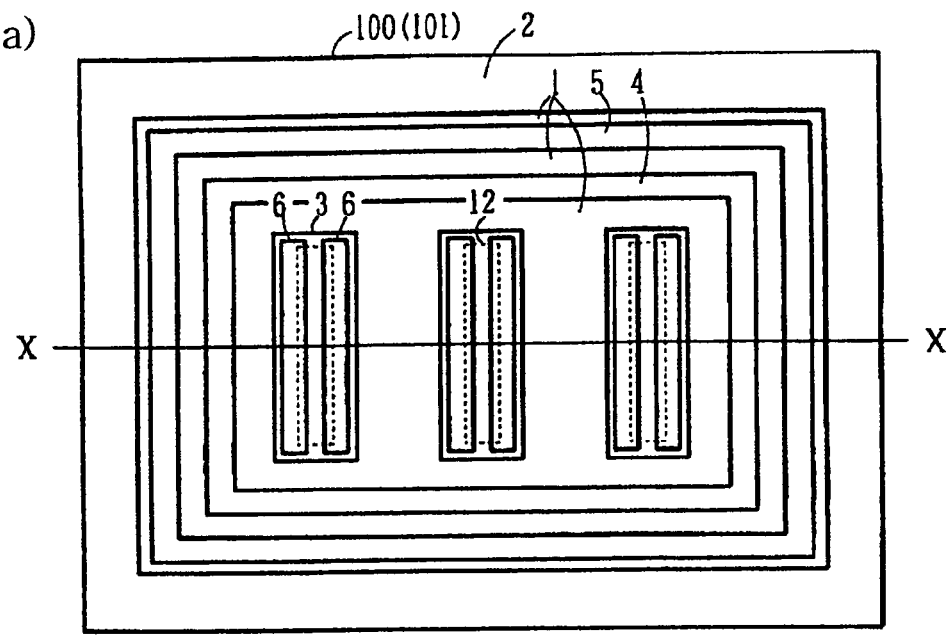
FIG. 32(a) is a top plan view of a conventional reverse blocking IGBT.
Figure 32B:
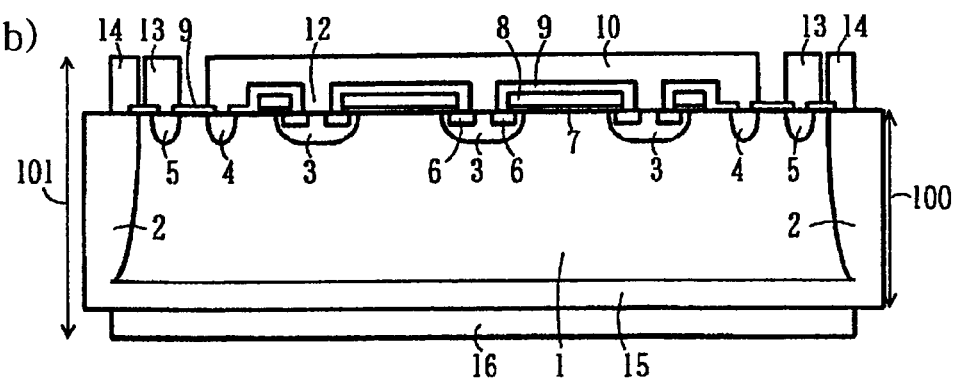
FIG. 32(b) is a cross sectional view of the conventional reverse blocking IGBT along the line segment X-X of FIG. 32(a).
Figure 33:
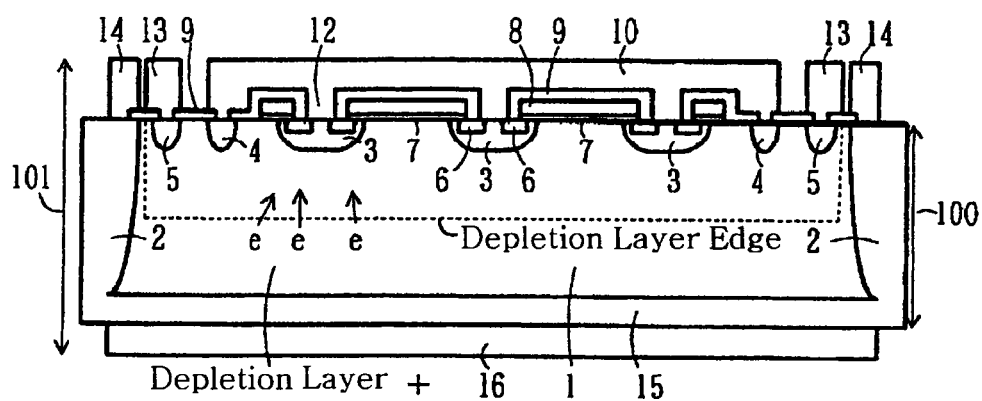
FIG. 33 is a cross sectional view of a conventional reverse blocking IGBT describing the biased state thereof.

FIG. 1(a) is a top plan view of a semiconductor device according to a first embodiment of the invention. FIG. 1(b) is a cross sectional view of the semiconductor device according to the first embodiment along the line segment X-X of FIG. 1(a). FIG. 1(a) shows the pattern in the semiconductor substrate surface. The semiconductor device according to the first embodiment is a reverse blocking IGBT exhibiting a forward breakdown voltage and a reverse breakdown voltage, which are symmetric to each other. The same reference numerals as used in FIGS. 32(a) and 32(b) are used in FIGS. 1(a) and 1(b) to designate the same constituent elements.

Referring now to FIGS. 1(a) and 1(b), the reverse blocking IGBT includes n$^-$-type drift region 1 as a semiconductor substrate; stripe-shaped cells in n$^-$-type drift region 1; p-type base region 3 in the surface portion of each of the cells; n$^+$-type emitter regions 6 and 6 in the surface portion of p-type base region 3; gate electrode 8 above the extended portion of p-type base region 3 that extend between n$^+$-type emitter region 6 and n$^-$-type drift region 1 with gate insulation film 7 interposed between gate electrode 8 and the extended portion of p-type base region 3; emitter electrode 10 in contact with p-type base regions 3 and n$^+$-type emitter regions 6 through holes 12; interlayer insulation film 9 that insulates gate electrode 8 and emitter electrode 10 from each other; Schottky junction 11 formed by making emitter electrode 10 and a part of the extended portion of n$^-$-type drift region 1 that extends between p-type base regions 3 contact each other in a Schottky contact; p$^+$-type collector region 15 on the back surface of n$^-$-type drift region 1; p$^+$-type separation region 2 in contact with p$^+$-type collector region 15 and the side faces of n$^-$-type drift region 1; and collector electrode 16 on p$^+$-type collector region 15. The surface portions of n$^-$-type drift region 1 between the adjacent cells in the reverse blocking IGBT are covered with interlayer insulation film 9 and isolated electrically from emitter electrode 10. The planar pattern of Schottky junction 11 is shaped as a stripe extending in parallel to p-type base regions 3.

On the inside of p$^+$-type separation region 2, a second semiconductor region of the second conductivity type 4 (a second p-type semiconductor region 4, hereinafter referred to as a "p-type region 4") for extracting holes, and a p-type region 5 for securing a certain breakdown voltage are formed such that these p-type regions surrounding the active region including p-type base regions 3.

When contact holes 12 are too narrow due to fine patterning, contact holes 12, each reaching p-type base region 3 between two n$^+$-type emitter regions 6, sometimes are formed. In this case, a lattice of n$^+$-type emitter region 6 can be formed sometimes by connecting two n$^+$-type emitter regions 6 with narrow n$^+$-type regions so that n$^+$-type emitter regions 6 and emitter electrode may be brought surely into contact with each other.

FIGS. 2 through 7 are cross sectional views for describing the steps for manufacturing the semiconductor devices according to the embodiments of the invention. Explanations will be made first in connection with the manufacture of a reverse blocking IGBT exhibiting a breakdown voltage of the 600 V class.

Figure 2:
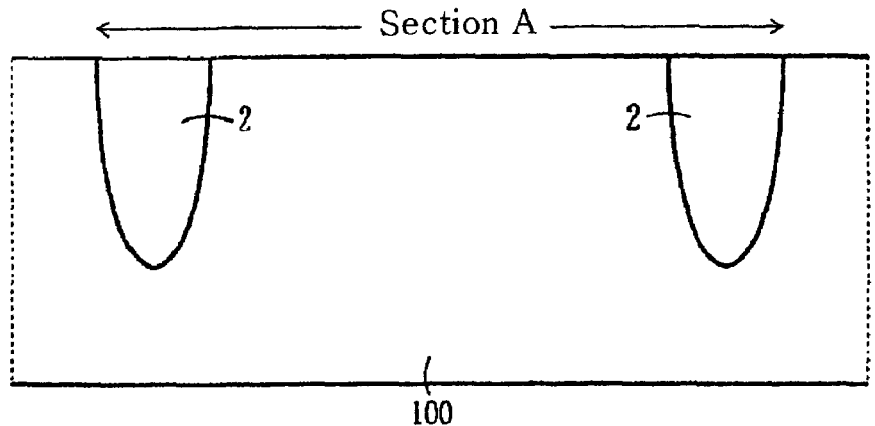
FIGS. 2 through 7 are cross sectional views describing the steps for manufacturing the semiconductor devices according to the embodiments of the invention.

At first, an initial oxide film of 1800 nm in thickness (not shown) is formed on an FZ-n-type silicon wafer (n$^-$-type wafer: semiconductor substrate 100); the specific resistance thereof is 28 Ωcm. Referring now to FIG. 2, the portion of the initial oxide film, which will be a scribing line later, is removed for the width of 200 µm. A borophosphosilicate glass (BPSG) film is formed on the entire surface of the wafer. Then, the boron atoms in the BPSG film are diffused through the portion, from which the initial oxide film has been removed locally, by treating the BPSG film thermally at 1300° for 83 hours to form a p$^+$-type separation region 2 for securing a certain reverse breakdown voltage. At this stage, p$^+$-type separation region 2 is 120 µm in depth.

Figure 3:
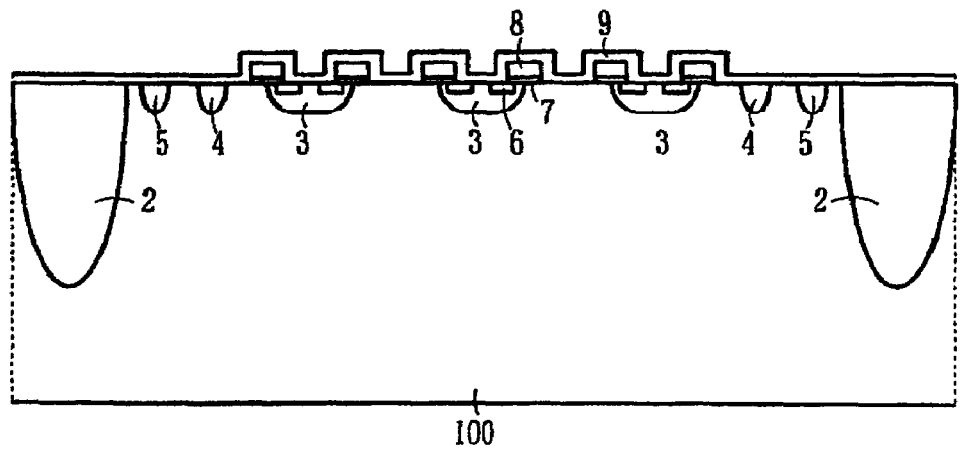

Referring now to FIG. 3, p-type base regions 3 for the respective cells, p-type region 4 for extracting holes, and p-type region 5 for securing a certain breakdown voltage are formed in the surface portion of semiconductor substrate 100, that is an n$^-$-type wafer, surrounded by p$^+$-type separation region 2. Then, n$^+$-type emitter regions 6 are formed in the surface portion of p-type base region 3. Gate electrode 8 is formed above the extended portion of p-type base region 3 that extends between n+-type emitter region 6 and semiconductor substrate 100 with gate insulation film 7 interposed between the extended portion of p-type base region 3 and gate electrode 8. A BPSG film, that will become interlayer insulation film 9 later, is formed on the surface of the semiconductor wafer. The cell is shaped as a stripe. Alternatively, the cell may be shaped as an island with no problem.

Figure 4:
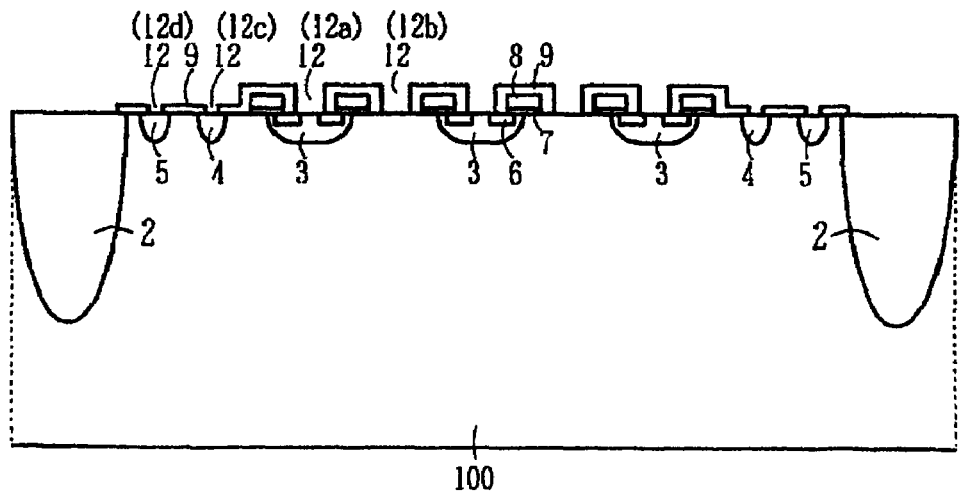

Referring now to FIG. 4, contact holes 12, which will become emitter contact holes 12a and Schottky contact holes 12b, are formed simultaneously in the BPSG film for interlayer insulation film 9. Simultaneously with forming contact holes 12 for emitter contact holes 12a and Schottky contact holes 12b, contact holes 12c and 12d for p-type regions 4 and 5 are formed. Emitter contact holes 12a, formed through the BPSG film down to the respective n+-emitter regions 6 and p-type base regions 3, are 6 μm in width and spaced 24 μm apart from each other. The surface impurity concentration of p-type base region 3 is $5 \times 10^{17}/cm^3$ and the depth thereof is 3 μm. To prevent latching up, boron ions are implanted at the dose amount of $3 \times 10^{15}/cm^2$ and at an acceleration voltage of 100 keV. The implanted boron atoms are treated at 1000° for 10 minutes. Schottky contact holes 12b are 10 μm or narrower in width and preferably between 2 μm and 10 μm. When the width of Schottky contact holes 12b is smaller than 2 μm the area of Schottky junction is so narrow that the electron extraction effects is impaired and the reduction rate of the leakage current is lowered. When the width of Schottky contact holes 12b is wider than 10 μm, the accumulated amount of the electrons injected from n+-emitter regions 6 to n−-type drift region 1 via the channels in the ON-state of the IGBT reduces, causing a higher on-voltage.

The planar pattern of Schottky contact hole 12b is shaped as a stripe extending in parallel to p-type base regions 3. Alternatively, the planar pattern of Schottky contact hole 12b may be shaped as an island with no problem.

Figure 5:
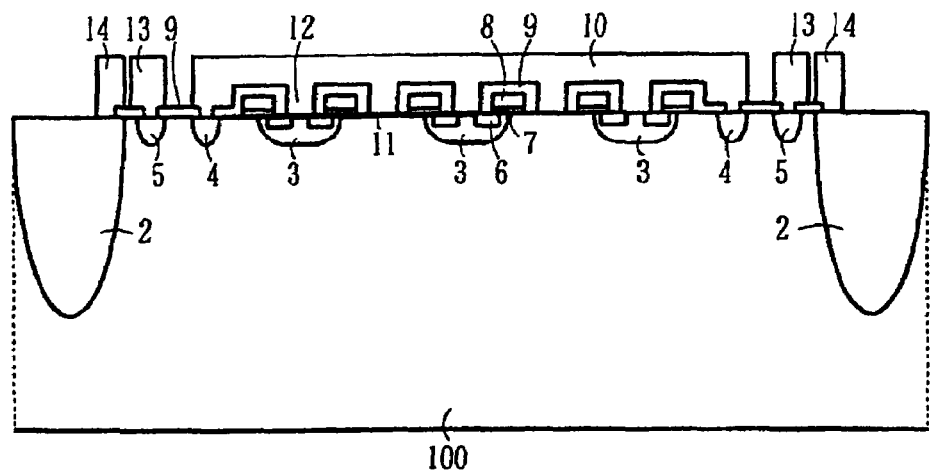

Referring now to FIG. 5, emitter electrode 10 is formed by sputtering Al containing 1.0% of Si (hereinafter referred to as "Al—Si1.0%"). Emitter electrode 10 is in ohmic contact with p-type base regions 3 and n+-type emitter regions 6. Emitter electrode 10 is in Schottky contact with n−-type drift region 1, forming Schottky junctions 11. The peripheral portion of emitter electrode 10 is in ohmic contact with p-type region 4. Simultaneously with forming emitter electrode 10, metal films 13 and 14 of Al—Si1.0% are formed by sputtering. Metal film 13 is in ohmic contact with p-type region 5 and metal film 14 with p+-type separation region 2. Before sputtering the Al—Si1.0%, other metal layers such as platinum silicide layers may be formed. Here, the barrier height φB of the metal to be deposited should be considered.

In FIG. 35, the current at a sufficiently low voltage of 0.5 V or lower (saturation current) is determined by the well known theory of thermal emission in the Schottky contact. In other words, the saturation current is determined by the amount of electrons emitted from the semiconductor side to the metal side across the Schottky junction. When the barrier height is too low, the saturation current becomes high, and, therefore, the total forward leakage current becomes high. Therefore, the metals having a barrier height of 0.5 eV or higher are preferable. For example, the barrier height of Al is about 0.7 eV, the barrier height of platinum silicide ($PtSi_2$) is 0.78 eV, and the barrier height of Pt is 0.90 eV. In addition, by sintering Al—Si1.0% at 420° for 80 minutes as is well known in the art, the substantial barrier height thereof is raised to 0.92 eV. The electron extraction through the pn-junction is controlled by setting the barrier height to be lower than 1.1 eV, the band gap of silicon, so that electrons generated in the depletion layer may be extracted predominantly through the Schottky junction.

Figure 6:
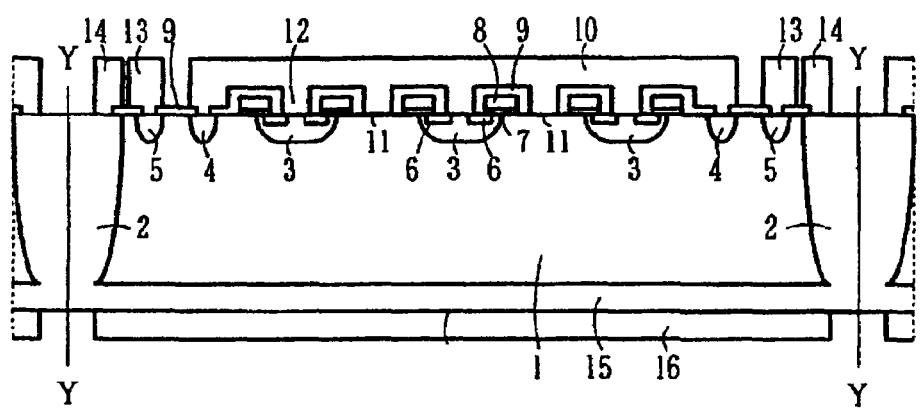

Next, a surface protection film (not shown) is coated and the back surface of semiconductor substrate 100 is lapped until the total thickness is 120 μm. Then, only the back surface of the lapped semiconductor substrate is etched with a mixture of hydrofluoric acid and nitric acid to remove 20 μm so that the thickness of the semiconductor substrate 100 is 100 μm. Referring now to FIG. 6, boron ions are implanted at the dose amount of $1 \times 10^{14}/cm^2$ and at an acceleration voltage of 45 keV into the back surface portion of the semiconductor substrate. Then, p+-type collector region 15 is formed by annealing the semiconductor substrate with boron atoms implanted to the back surface portion thereof at a low temperature between 350° and 550° (e.g., at 420°) such that p+-type collector region 15 is in contact with p+-type separation region 2. Then, collector electrode 16 is formed on p+-type collector region 15.

Figure 7:
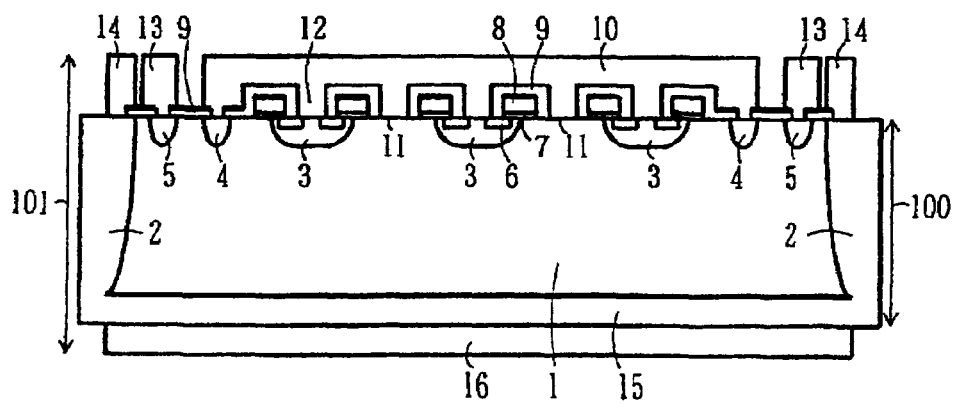

Referring now to FIG. 7, by dicing the central portion of p+-type separation region 2 (indicated by the line segments Y-Y in FIG. 7), a reverse blocking IGBT chip 101 is completed.

In the reverse blocking IGBT manufactured as described above, the electron current caused in the back surface portion thereof flows to Schottky junctions 11 without entering p-type base regions 3 when a reverse bias voltage is applied to the IGBT. Therefore, the amplification effect caused by the pnp structures is killed and the leakage current is reduced.

Now the method of manufacturing an IGBT exhibiting a breakdown voltage of the 1200 V class will be described below with reference to the foregoing FIGS. 2 through 7. Initially, an oxide film of 2400 nm in thickness (not shown) is formed on an FZ-n-type silicon wafer (n−-type wafer: semiconductor substrate 100), the specific resistance thereof is 90 Ωcm. Referring again to FIG. 2, a portion of the initial oxide film, which will be a scribing line later, is removed for the width of 200 μm. A borophosphosilicate glass (BPSG) film is formed on the entire surface of the wafer. Then, the boron atoms in the BPSG film are diffused through the portion, from which the initial oxide film has been removed locally, by treating the BPSG film thermally at 1300° for 230 hours to form a p+-type separation region 2 for securing a certain reverse breakdown voltage. At this stage, p+-type separation region 2 is 200 μm in depth.

Referring now to FIG. 3, p-type base regions 3 for the respective cells, a p-type region 4 for extracting holes, and a p-type region 5 for securing a certain breakdown voltage are formed in the surface portion of semiconductor substrate 100 that is an n−-type wafer, surrounded by p+-type separation region 2. Then, n+-type emitter regions 6 are formed in the surface portion of p-type base region 3. Gate electrode 8 is formed above the extended portion of p-type base region 3 that extends between n+-type emitter region 6 and semiconductor substrate 100 with gate insulation film 7 interposed between the extended portion of p-type base region 3 and gate electrode 8. A BPSG film, that will become interlayer insulation film 9 later, is formed on the surface of the semiconductor wafer. The cell is shaped as a stripe. Alternatively, the cell may be shaped as an island with no problem.

Referring now to FIG. 4, contact holes 12, which will become emitter contact holes 12a and Schottky contact holes 12b, are formed simultaneously in the BPSG film for interlayer insulation film 9. Simultaneously with forming contact holes 12 for emitter contact holes 12a and Schottky contact holes 12b, contact holes 12c and 12d for p-type regions 4 and 5 are formed. Emitter contact holes 12a, formed through the BPSG film down to the respective n$^+$-emitter regions 6 and p-type base regions 3, are 6 μm in width and spaced 24 μm apart from each other. The surface impurity concentration of p-type base region 3 is 5'$10^{17/cm3}$ and the depth thereof is 3 μm. To prevent latching up, boron ions are implanted at the dose amount of 3×$10^{15}$/cm$^2$ and at an acceleration voltage of 100 keV. The implanted boron atoms are treated at 1000° for 10 minutes. Schottky contact holes 12b are 10 μm or narrower in width and preferably between 2 μm and 10 μm. When the width of Schottky contact holes 12b is smaller than 2 μm, the area of Schottky junction is so narrow that the electron extraction effects are impaired and the reduction rate of the leakage current is lowered. When the width of Schottky contact holes 12b is wider than 10 μm, the accumulated amount of the electrons injected from n$^+$-emitter regions 6 to n$^-$-type drift region 1 via the channels in the ON-state of the IGBT reduces, causing a higher on-voltage.

The planar pattern of Schottky contact hole 12b is shaped as a stripe extending in parallel to p-type base regions 3. Alternatively, the planar pattern of Schottky contact hole 12b may be shaped as an island with no problem.

Referring now to FIG. 5, emitter electrode 10 is formed by sputtering Al—Si1.0%. Emitter electrode 10 is in ohmic contact with p-type base regions 3 and n$^+$-type emitter regions 6. Emitter electrode 10 is in Schottky contact with n$^-$-type drift region 1, forming Schottky junctions 11. The peripheral portion of emitter electrode 10 is in ohmic contact with p-type region 4. Simultaneously with forming emitter electrode 10, metal films 13 and 14 of Al—Si1.0% are formed by sputtering. Metal film 13 is in ohmic contact with p-type region 5 and metal film 14 with p$^+$-type separation region 2.

A surface protection film (not shown) is coated and the back surface of semiconductor substrate 100 is lapped until the total thickness is 200 μm. Then, only the back surface of the lapped semiconductor substrate is etched with a mixture of hydrofluoric acid and nitric acid to remove 20 μm so that the total thickness of the semiconductor substrate 100 is 180 μm. Referring now to FIG. 6, boron ions are implanted at the dose amount of 1×$10^{15}$/cm$^2$ and at an acceleration voltage of 45 keV into the back surface portion of the semiconductor substrate. Then, p$^+$-type collector region 15 is formed by annealing the semiconductor substrate with boron atoms implanted to the back surface portion thereof at a low temperature between 350° and 550° (e.g., at 420°) such that p$^+$-type collector region 15 is in contact with p$^+$-type separation region 2. Then, collector electrode 16 is formed on p$^+$-type collector region 15.

Referring now to FIG. 7, by dicing the central portion of p$^+$-type separation region 2 (indicated by the line segments Y-Y in FIG. 7), reverse blocking IGBT chip 101 is completed.

In the reverse blocking IGBT of the 1200 V class manufactured as described above, the electron current caused by reverse bias voltage application in the back surface portion thereof flows to Schottky junctions 11 without entering p-type base regions 3 in the same manner as in the reverse blocking IGBT of the 600 V class. Therefore, the amplification effect caused by the pnp structures is killed and the leakage current is reduced.

Figure 8:
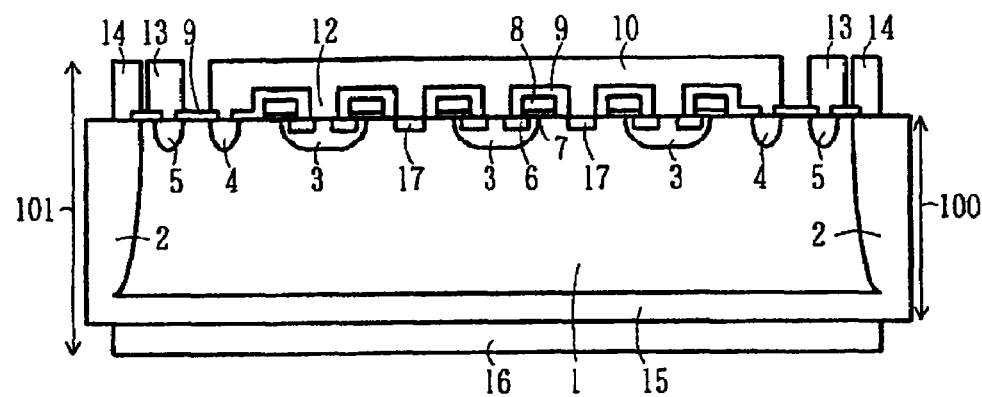
FIG. 8 is a cross sectional view of a semiconductor device according to a second embodiment of the invention.

FIG. 8 is a cross sectional view of a semiconductor device according to a second embodiment of the invention. The top plan view of the semiconductor device according to the second embodiment is the same with that shown in FIG. 1(a). The semiconductor device according to the second embodiment is a reverse blocking IGBT.

The IGBT according to the second embodiment is different from the IGBT according to the first embodiment shown in FIGS. 1(a) and 1(b) in that first semiconductor regions of the second conductivity type 17 (first p-type semiconductor regions 17: hereinafter referred to as "p-type bypass regions 17") are formed, according to the second embodiment, in the surface portions of n$^-$-type drift region 1, in which Schottky junctions 11 are to be formed according to the first embodiment, and p-type bypass regions 17 are in ohmic contact with emitter electrode 10. The p-type bypass regions 17 are shaped as respective stripes extending in parallel to p-type base regions 3.

The IGBT according to the second embodiment is manufactured in the following way. Subsequent to the steps described with reference to FIGS. 2 through 4, boron ions are implanted at a low dose amount between 1×$10^{11}$/cm$^2$ and 1×$10^{14}$/cm$^2$ and at a low acceleration voltage of 45 keV or lower. Then, emitter electrode 10 is formed by sputtering Al—Si1.0%. A metal with a high melting point such as titanium nitride and platinum silicide may be deposited before the above described sputtering. The Al—Si1.0% layer is sintered at 420° for 80 minutes (cf FIG. 5).

This sintering serves also as low-temperature activation for the lightly doped p-type bypass regions 17. Then, a surface protection film is coated on the semiconductor wafer and the back surface of the semiconductor wafer is lapped. A collector region is formed by ion implantation and subsequent annealing. Finally, the central portions of p$^+$-type separation regions 2 are cut by dicing (cf FIG. 6) and a reverse blocking IGBT chip is completed. In the reverse blocking IGBT manufactured as described above, the electron current caused by reverse bias voltage application in the back surface portion thereof flows out from lightly doped bypass regions 17 without entering heavily doped p-type base regions 3. Therefore, the amplification effect caused by the pnp structures is killed and the leakage current is reduced.

According to the second embodiment, lightly doped p-type bypass regions 7 are formed by ion implantation after the formation of the contact holes. Alternatively, p-type bypass regions 7 may be formed at an earlier stage, e.g., at the step as described in FIG. 3. In yet another alternative, p-type bypass regions 7 may be formed not by ion implantation but of the extremely shallow diffusion regions (50 nm or shallower in depth) containing Al diffused from Al—Si1.0% during the sintering thereof.

The diffusion depth of p-type bypass region 7 should be smaller than the depth of p-type base region 3 working as a channel in the MOS section. When the diffusion depth of p-type bypass regions 7 is as deep as the depth of channel p-type base regions 3, the JFET Junction field effect transistor) effects are enhanced and the electron current injected from n$^+$-type emitter regions 6 via the channels is pinched in n$^-$-type drift region 1, causing a higher on-voltage. When the diffusion depth of p-type bypass regions 7 is smaller than 90% of the depth of p-type base regions 3, the JFET effects are low enough to suppress the increment of the on-voltage to be 0.1 V or lower.

Figure 9:
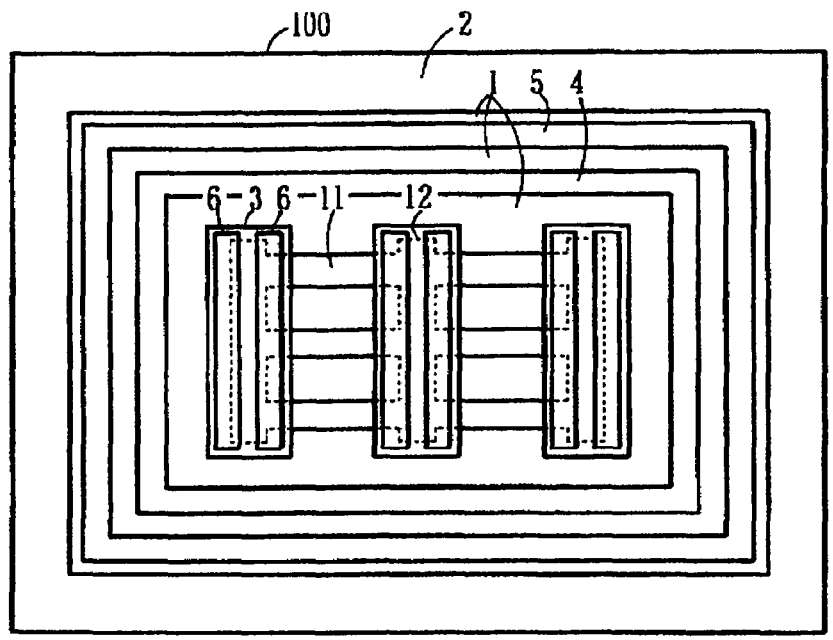
FIG. 9 is a top plan view of a semiconductor device according to a third embodiment of the invention.

FIG. 9 is a top plan view of a semiconductor device according to a third embodiment of the invention. The semiconductor device according to the third embodiment is different from the semiconductor device according to the first embodiment shown in FIG. 1(a) in that Schottky junctions 11 extend perpendicular to p-type base regions 3. The surface impurity concentrations of p-type base regions 3 and n$^+$-type emitter regions 6 are high in the portions where Schottky junctions 11 and p-type base regions 3 cross at the right angle. Therefore, p-type base regions 3 and n$^+$-type emitter regions 6 are in ohmic contact with emitter electrode 10 in the portions where Schottky junctions 11 and p-type base regions 3 cross at the right angle.

Figure 10:
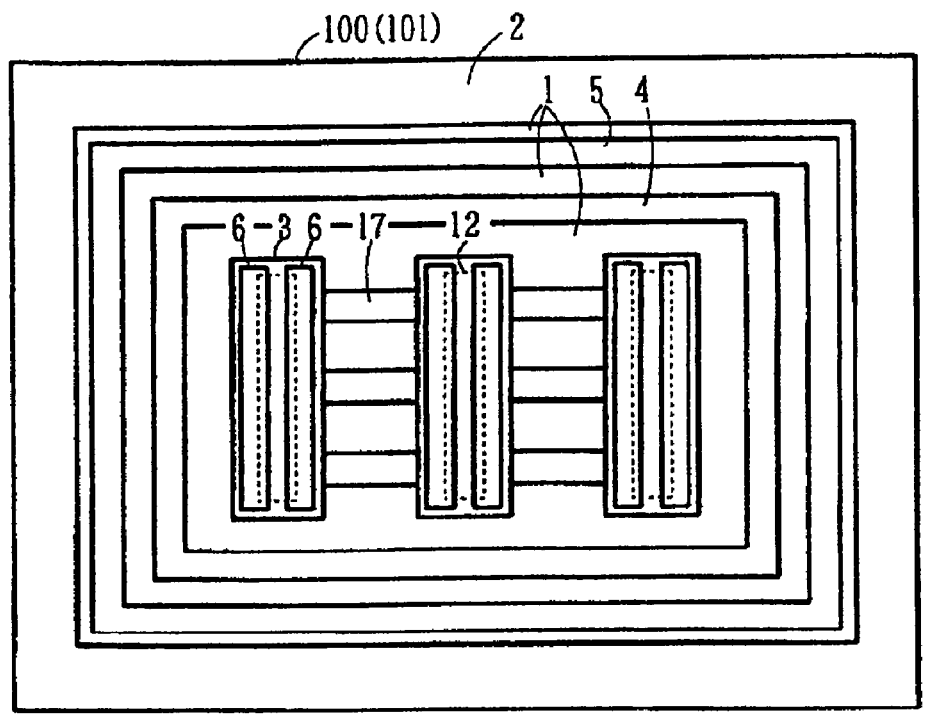
FIG. 10 is a top plan view of a semiconductor device according to a fourth embodiment of the invention.

FIG. 10 is a top plan view of a semiconductor device according to a fourth embodiment of the invention. The semiconductor device according to the fourth embodiment is different from the semiconductor device according to the third embodiment shown in FIG. 9 in that Schottky junctions 11 in the semiconductor device according to the third embodiment are replaced by the respective p-type bypass regions 17 according to the fourth embodiment.

By extending Schottky junctions 11 or p-type bypass regions 17 perpendicular to p-type base regions 3, the spacing between Schottky junctions 11 or the spacing between p-type bypass regions 17 may be widened. Therefore, the area of Schottky junctions 11 or the area of p-type bypass regions 17 extending perpendicular to p-type base regions 3 may be set to be narrower than the area of Schottky junctions 11 or the area of p-type bypass regions 17 extending in parallel to p-type base regions 3.

When the IGBT is biased at a reverse bias potential, electron extraction is weakened due to the narrow area of Schottky junctions 11 or p-type bypass regions 17, and the reverse leakage current increases more or less. However, when the area of Schottky junctions 11 or p-type bypass regions 17 is narrow, the amount of the electrons injected into $n^-$-type drift region 1 in the ON-state of the IGBT and accumulated in the upper portion of $n^-$-type drift region 1 increases. In association with this, the amount of the accumulated holes also increases, intensifying the degree of conductivity modulation in the upper portion of $n^-$-type drift region 1 and lowering the on-voltage. In summary, although the reverse leakage current is increased more or less, the on-voltage is lowered.

In the IGBTs according to the first through fourth embodiments, p-type base region 3 and Schottky junction 11 or p-type base region 3 and p-type bypass region 17 are shaped as respective stripes. In the following embodiments, either or both of p-type base region 3 and Schottky junction 11 or either or both of p-type base region 3 and p-type bypass region 17 are shaped as respective islands.

Figure 11:
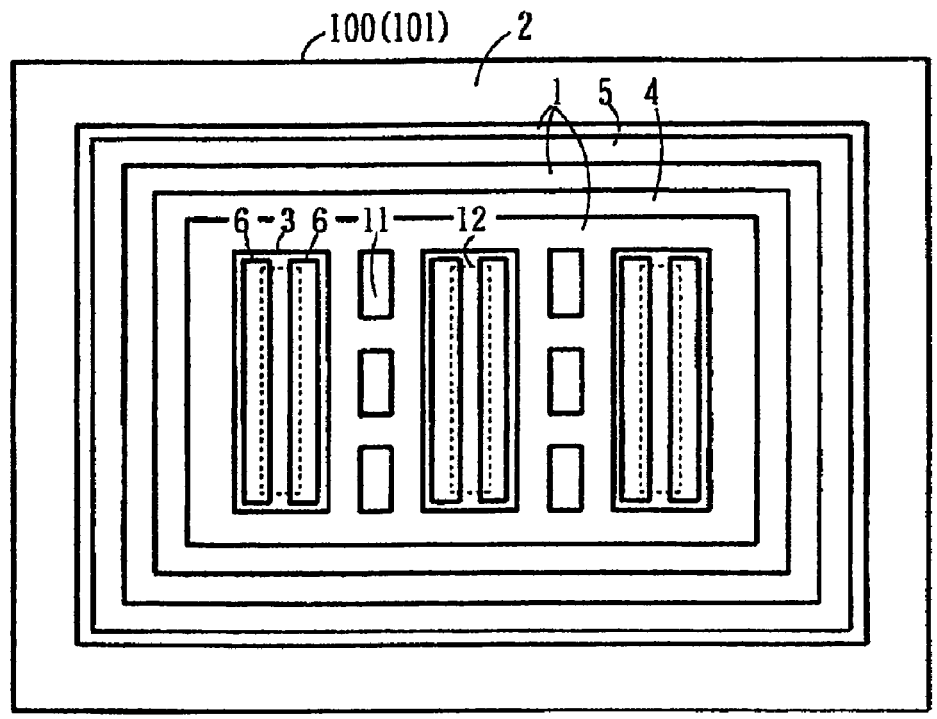
FIG. 11 is a top plan view of a semiconductor device according to a fifth embodiment of the invention.

FIG. 11 is a top plan view of a semiconductor device according to a fifth embodiment of the invention. In FIG. 11, Schottky junction 11 is shaped as an island and p-type base region 3 as a stripe. Since the area of Schottky junctions 11 in FIG. 11 is narrower than the area of Schottky junctions 11 in FIG. 1(a), the on-voltage of the IGBT in FIG. 11 is lower than the on-voltage of the IGBT in FIG. 1(a).

Figure 12:
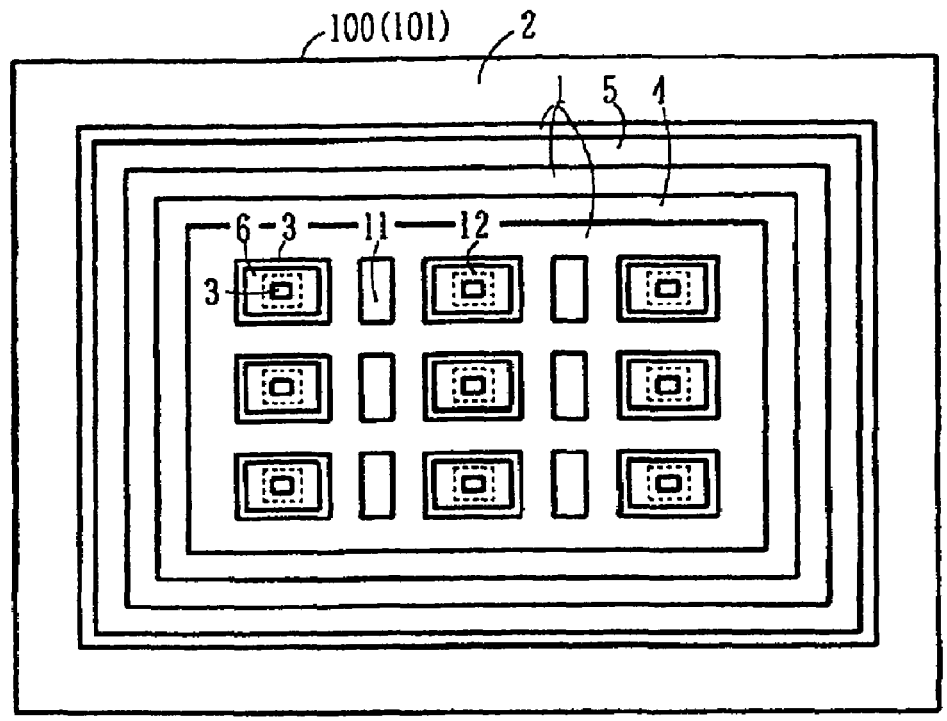
FIG. 12 is a top plan view of a semiconductor device according to a sixth embodiment of the invention.

FIG. 12 is a top plan view of a semiconductor device according to a sixth embodiment of the invention. In FIG. 12, Schottky junction 11 and p-type base region 3 are shaped as respective islands. In FIG. 12, the stripe-shaped p-type base regions 3 in FIG. 11 are replaced by island-shaped p-type base regions 3.

Figure 13:
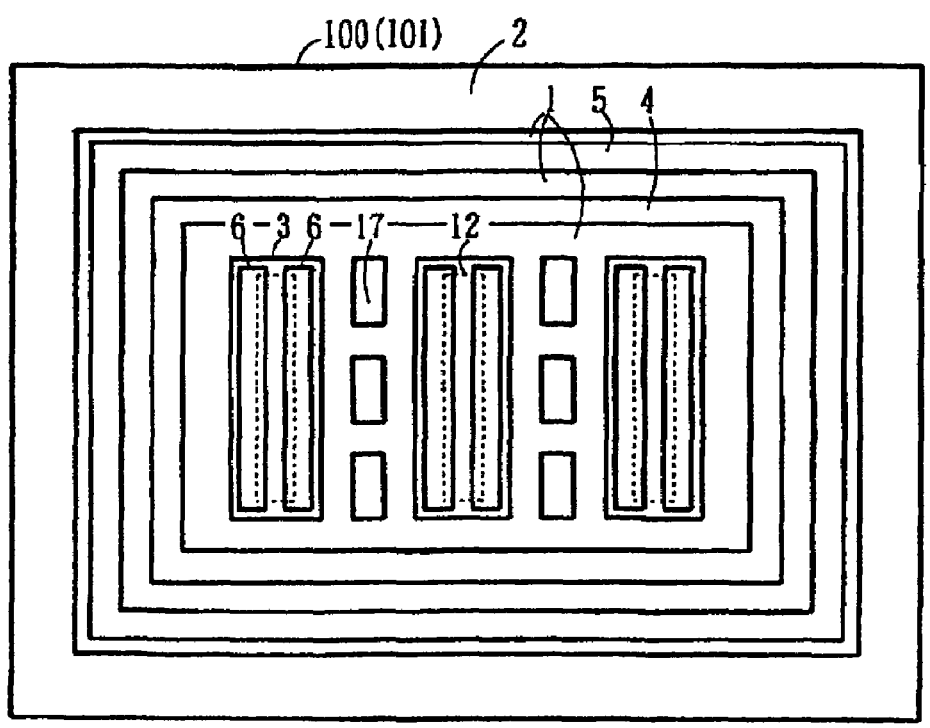
FIG. 13 is a top plan view of a semiconductor device according to a seventh embodiment of the invention.

FIG. 13 is a top plan view of a semiconductor device according to a seventh embodiment of the invention. In FIG. 13, p-type bypass region 17 is shaped as an island and p-type base region 3 as a stripe. The semiconductor device according to a seventh embodiment is different from the semiconductor device according to the fifth embodiment shown in FIG. 11 in that Schottky junctions 11 in FIG. 11 are replaced by p-type bypass regions 17 in FIG. 13. The semiconductor device shown in FIG. 13 exhibits the same effects as those of the semiconductor device shown in FIG. 11.

Figure 14:
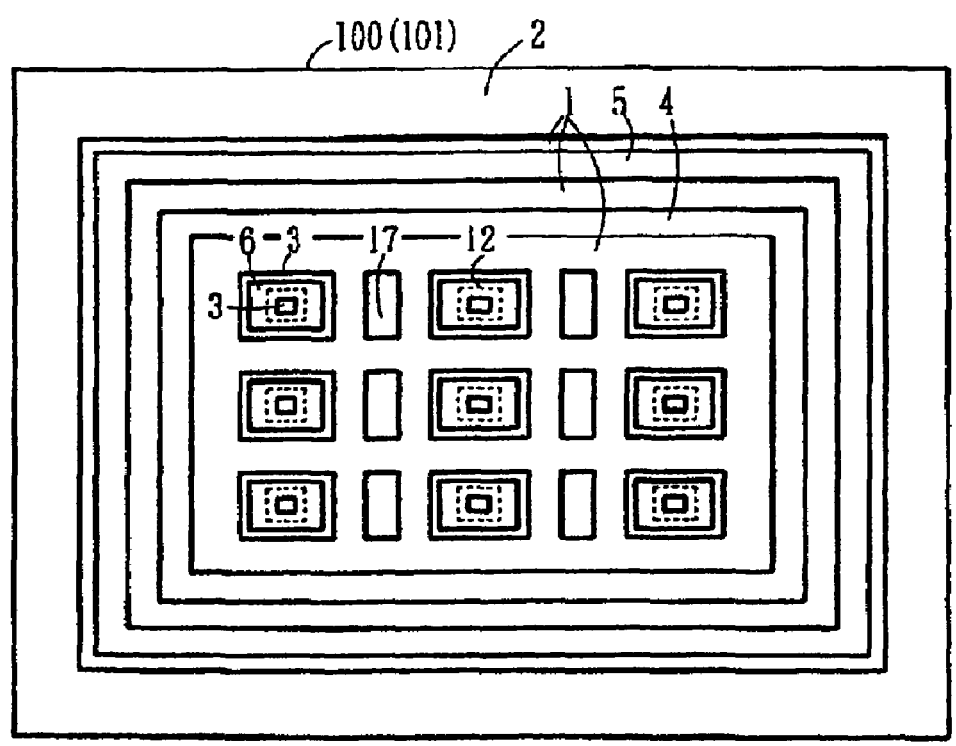
FIG. 14 is a top plan view of a semiconductor device according to an eighth embodiment of the invention.

FIG. 14 is a top plan view of a semiconductor device according to an eighth embodiment of the invention. In FIG. 14, p-type bypass region 17 and p-type base region 3 are shaped as respective islands. The semiconductor device shown in FIG. 14 is different from the semiconductor device shown in FIG. 12 in that Schottky junctions 11 in FIG. 12 are replaced by p-type bypass regions 17 in FIG. 14. The semiconductor device shown in FIG. 14 exhibits the same effects as the semiconductor device shown in FIG. 12.

Figure 15A:
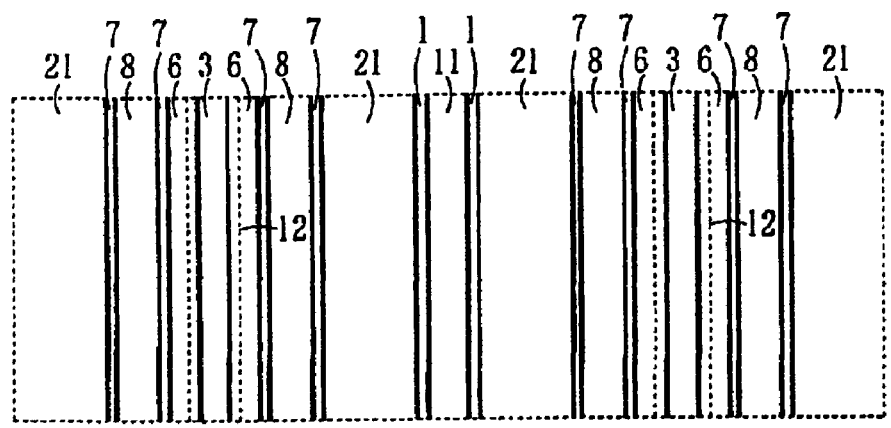
FIG. 15(a) is a top plan view of a semiconductor device according to a ninth embodiment of the invention.
Figure 15B:
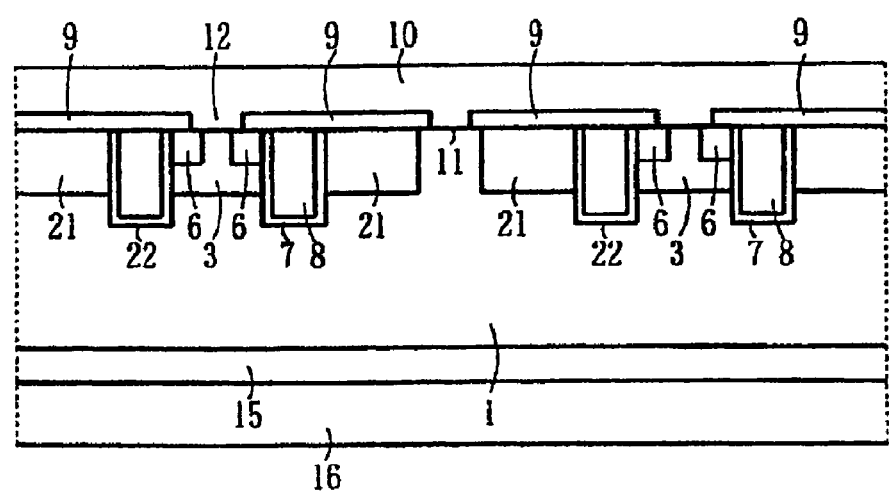
FIG. 15(b) is a cross sectional view of the semiconductor device shown in FIG. 15(a).

FIG. 15(a) is a top plan view of a semiconductor device according to the ninth embodiment of the invention showing the surface pattern on the semiconductor substrate thereof. FIG. 15(b) is a cross sectional view of the semiconductor device shown in FIG. 15(a).

Referring now to these figures, the semiconductor device according to a ninth embodiment includes an $n^-$-type drift region 1 as a semiconductor substrate; stripe-shaped cells in $n^-$-type drift region 1; trench 22 in each of the cells; p-type base region 3 in the surface portion of each of the cells; p-type region 21 in the surface portion of each of the cells facing opposite across trench 22 to the surface portion of the each of the cells, therein p-type base region 3 is formed; gate insulation film 7 on the side wall of trench 22; gate electrode 8 filling trench 22; $n^+$-type emitter regions 6 in the surface portion of p-type base region 3, $n^+$-type emitter region 6 being in contact with gate insulation film 7 on the side wall of trench 22; emitter electrode 10 in contact with $n^+$-type emitter regions 6 and p-type base regions 3 via contact holes 12; interlayer insulation film 9 insulating gate electrodes 8 and emitter electrode 10 from each other; Schottky junction 11 formed of a part of emitter electrode 10 and a part of the extended portion of $n^-$-type drift region 1 that extends between p-type regions 21 of the adjacent cells in Schottky contact with each other; $p^+$-type collector region 15 on the back surface of $n^-$-type drift region 1; $p^+$-type separation region 2 on the side faces of $n^-$-type drift region 1 and in contact with $p^+$-type collector region 15 ($p^+$-type separation region 2 being formed in the same manner as in FIGS. 1(a) and 1(b)); and collector electrode 16 on $p^+$-type collector region 15. As shown in FIG. 15(a), the planar pattern of Schottky junction 11 is shaped as a stripe extending in parallel to trenches 22.

On the inner side of $p^+$-type separation region 2, p-type region 4 for extracting holes and p-type region 5 for securing a certain breakdown voltage are formed such that these p-type regions surround the active region including p-type base regions 3.

The semiconductor device shown in FIGS. 15(a) and 15(b) is different from the semiconductor device shown in FIGS. 1(a) and 1(b) in that the semiconductor device shown in FIGS. 15(a) and 15(b) has a trench gate structure. The semiconductor device shown in FIGS. 15(a) and 15(b) exhibits the same effects as those of the semiconductor device shown in FIGS. 1(a) and 1(b). As described above, p-type base region 3 is formed between trenches 22 and $n^+$-type emitter regions 6 are formed in the surface portion of p-type base region 3. On the side facing opposite to $n^+$-type emitter region 6 across trench 22, p-type region 21, which is a floating region, is formed. The extended portion of $n^-$-type drift region 1 that extends between p-type regions 21 is in Schottky contact with emitter electrode 10. The p-type region 21 facilitates expanding the depletion layer when the IGBT is in the forward blocking state thereof, and relaxes the electric field localization in the bottom of the trench. Schottky junction 11 may be connected to or spaced apart from p-type region 21. For reducing the reverse leakage current more effectively, it is better to separate Schottky junction 11 from p-type region 21 as shown in FIGS. 15(a) and 15(b).

Figure 16:
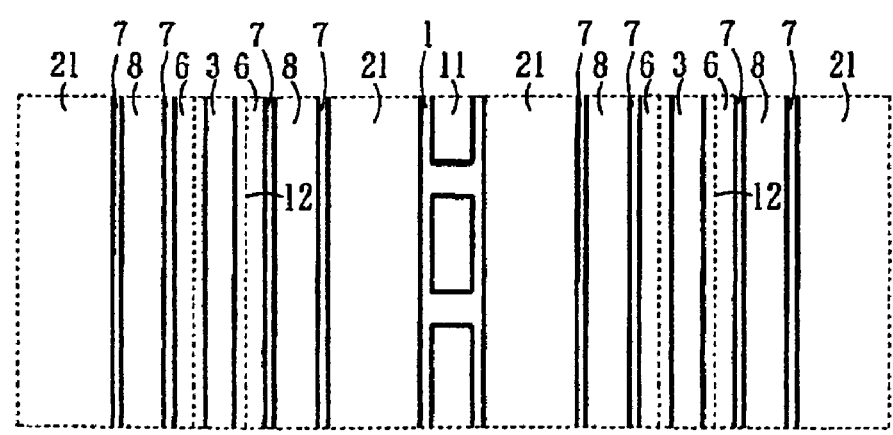
FIG. 16 is a top plan view of a semiconductor device according to a tenth embodiment of the invention.

FIG. 16 is a top plan view of a semiconductor device according to a tenth embodiment of the invention showing the surface pattern on the semiconductor substrate thereof. The semiconductor device shown in FIG. 16 is different from the semiconductor device shown in FIG. 15(a) in that Schottky junctions 11 are shaped as respective islands. Since the area of the Schottky junctions is narrow due to the island-shape thereof, the on-voltage of the semiconductor device shown in FIG. 16 is lowered.

Figure 17:
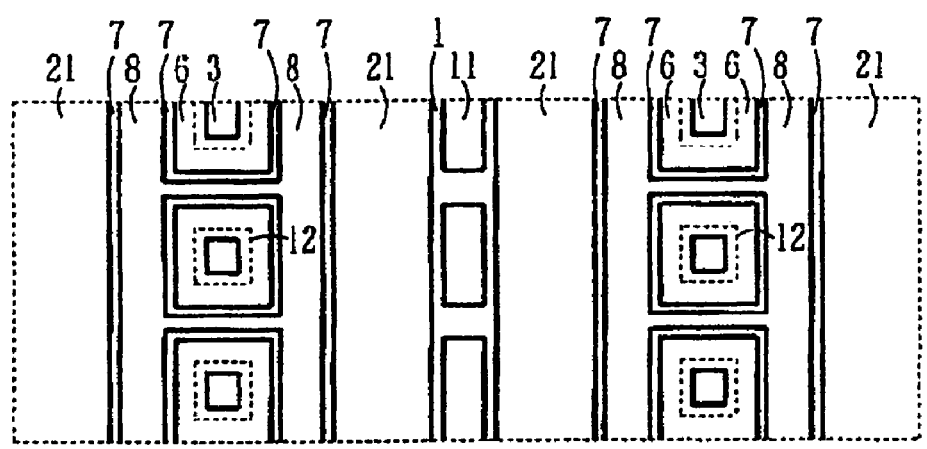
FIG. 17 is a top plan view of a semiconductor device according to an eleventh embodiment of the invention.

FIG. 17 is a top plan view of a semiconductor device according to an eleventh embodiment of the invention showing the surface pattern on the semiconductor substrate thereof. The semiconductor device shown in FIG. 17 is different from the semiconductor device shown in FIG. 16 in that p-type base regions 3 are shaped as respective islands. In the top plan view, rudder-shaped trench 22 surrounds island-shaped p-type base regions 3 aligned and n$^+$-type emitter region 6 is formed in the surface portion of each p-type region 3. Schottky junctions 11 and p-type regions 21 are arranged on the side facing opposite to n$^+$-type emitter regions 6 across trench 22.

Figure 18:
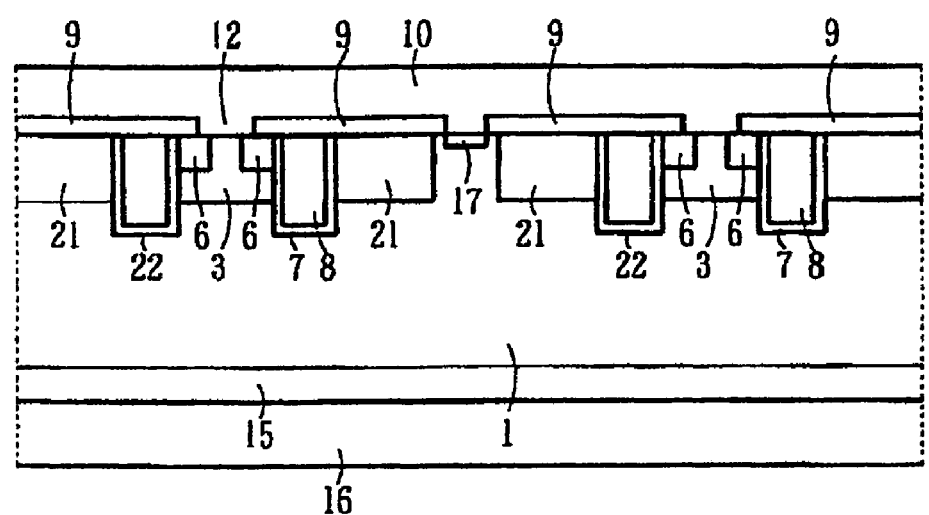
FIG. 18 is a cross sectional view of a semiconductor device according to a twelfth embodiment of the invention.

FIG. 18 is a cross sectional view of a semiconductor device according to a twelfth embodiment of the invention. The semiconductor device shown in FIG. 18 is different from the semiconductor device shown in FIG. 15($b$) in that Schottky junction 11 in FIG. 15($b$) is replaced by bypass region 17 in FIG. 18. The semiconductor device shown in FIG. 18 exhibits the same effects as those of the semiconductor device shown in FIG. 15($b$).

Figure 19:
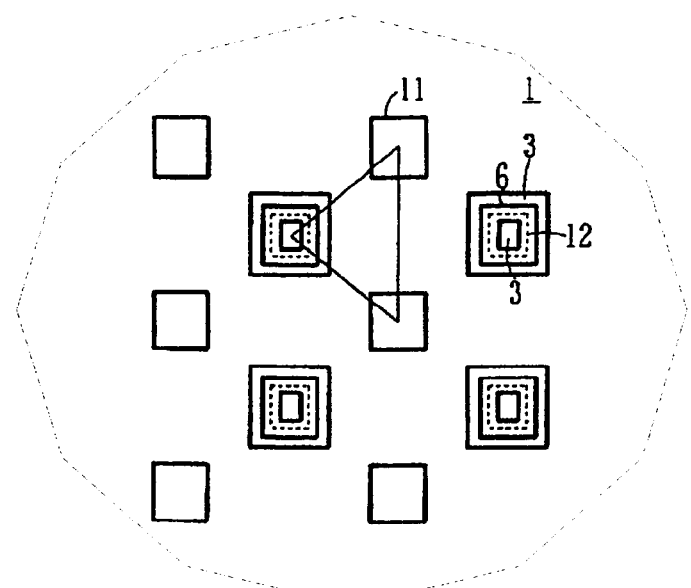
FIG. 19 is a top plan view of a semiconductor device according to a thirteenth embodiment of the invention.

FIG. 19 is a top plan view of a semiconductor device according to a thirteenth embodiment of the invention showing the surface pattern on the semiconductor substrate thereof. The semiconductor device shown in FIG. 19 is different from the semiconductor device shown in FIG. 17 in that p-type base regions 3 and Schottky junctions 11 are shaped as respective islands positioned on the vertices of a triangle in FIG. 19. In detail, two Schottky junctions 11 and one p-type base region 3 are arranged at the lattice points of a lattice shaped almost as an equilateral triangle. By setting the side of the triangle to be 10 μm or shorter, the depletion layer is pinched off easily when a high voltage is applied in the forward direction with the gate turned off (set at 0 V). In association with the pinching off of the depletion layer, the electric field strength in the Schottky portion surface is reduced and, therefore, the forward leakage current caused by the Schottky portion is reduced. It is preferable to set the unit length, at which the unit structure such as the above described triangular lattice and the foregoing stripe is repeated cyclically, to be 10 μm or shorter.

The same descriptions as made for Schottky junction 11 above may be made on p-type bypass region 17. Since p-type bypass region 17 is as shallow as about 0.5 μm, the forward leakage current caused by p-type bypass region 17 becomes higher with rising electric field strength in the same manner as described in connection with Schottky junction 11.

Figure 20:
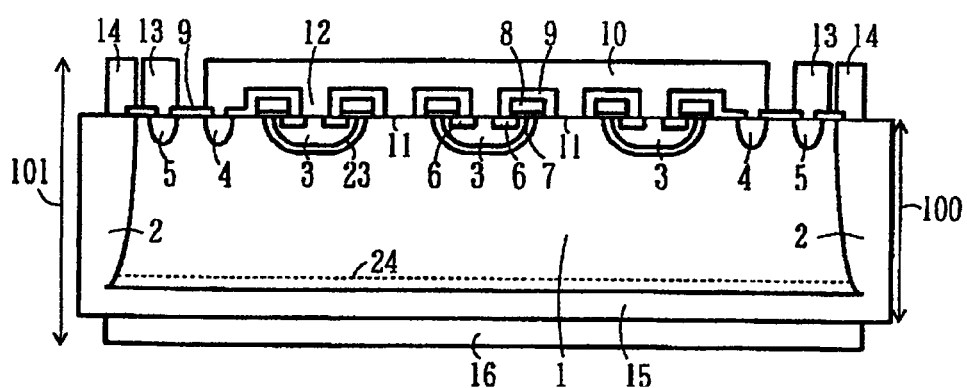
FIG. 20 is a cross sectional view of a semiconductor device according to a fourteenth embodiment of the invention.

FIG. 20 is a cross sectional view of the semiconductor device according to a fourteenth embodiment of the invention. The semiconductor device shown in FIG. 20 is different from the semiconductor device shown in FIG. 1($b$) in that first n-type buffer region 23, thin and surrounding p-type base region 3, is formed, and second n-type buffer region 24 is formed in n$^-$-type drift region 1 such that second n-type buffer region 24 is in contact with p$^+$-type collector region 15.

First and second n-type buffer regions 23 and 24 are formed to reduce the efficiencies of the hole injection from p$^+$-type collector region 15 and p-type base regions 3. First, n-type buffer regions 23 are formed before forming p-type base regions 3, by irradiating phosphorus ions at a dose amount of 5×10$^{12}$/cm$^2$ and at an acceleration voltage of 100 keV and by driving the implanted phosphorus atoms at 1150° for 90 minutes. Second n-type buffer region 24 is formed before forming p$^+$-type collector region 15, by irradiating phosphorus ions at a dose amount of 5×10$^{12}$/cm$^2$ and at an acceleration voltage of 100 keV, and by driving the implanted phosphorus atoms at 1150° for 90 minutes. Then, p-type base regions 3 and p$^+$-type collector region 15 are formed by the method described earlier. By employing the structure described above, first n-type buffer regions 23 work as barriers for suppressing the flowing-in of the holes from p-type base regions 3 and, therefore, the reverse leakage current is reduced. Even when the hole injection from p$^+$-type collector region 15 is suppressed by second n-type buffer region 24 in the ON-state of the IGBT, holes are prevented from flowing into p-type base regions 3 by first n-type buffer regions 23, accumulating the holes in n-type drift region 1, amplifying the conductivity modulation and reducing the on-voltage of the IGBT. By forming p-type bypass region 17 in the portion where Schottky junction 11 is to be formed, the same effects as those obtained by Schottky junctions 11 are obtained.

When only first n-type buffer regions 23 are formed, the forward blocking capability is lowered. When only second n-type buffer region 24 is formed, the reverse blocking capability is lowered. When both first and second n-type buffer regions 23 and 24 are formed, both the forward blocking capability and the reverse blocking capability are lowered.

Thus, by forming n-type buffer region 24 on the back surface side of the IGBT, a reverse blocking IGBT of the PT-type is obtained. The blocking capabilities are a function of the widths and the impurity concentrations of first and second n-type buffer regions 23 and 24. As the widths of n-type buffer regions 23 and 24 become wider and the impurity concentrations therein become higher, the blocking capabilities tend to be lower.

Figure 21:
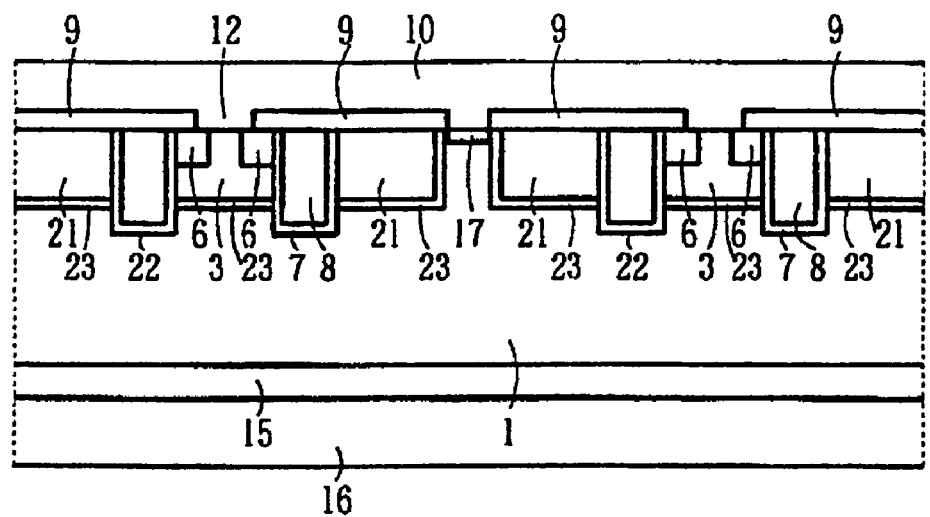
FIG. 21 is a cross sectional view of a semiconductor device according to a fifteenth embodiment of the invention.

FIG. 21 is a cross sectional view of a semiconductor device according to a fifteenth embodiment of the invention. The semiconductor device shown in FIG. 21 is different from the semiconductor device shown in FIG. 18 in that first n-type buffer regions 23 are formed such that first n-type buffer regions 23 surround p-type base regions 3 and p-type regions 21 in FIG. 21. By forming first n-type buffer regions 23 as described above, the reverse leakage current is reduced and the on-voltage is lowered.

Figure 22:
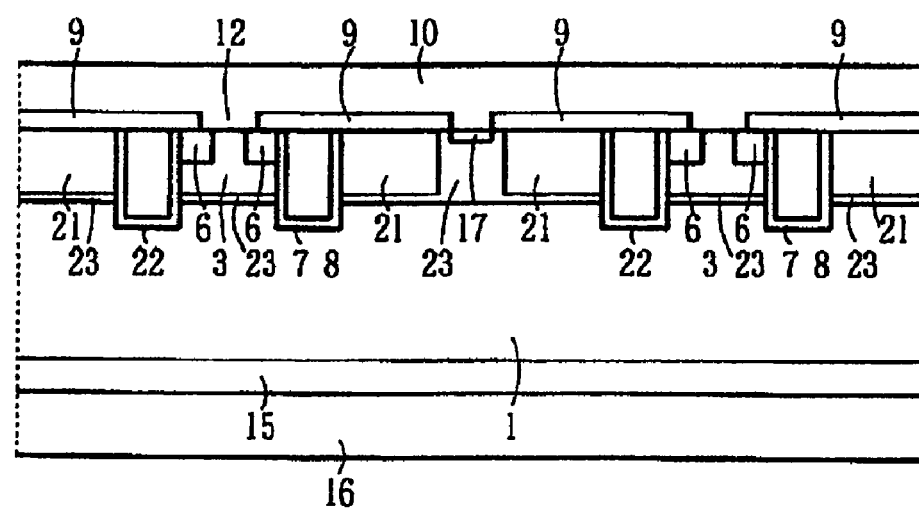
FIG. 22 is a cross sectional view of a semiconductor device according to a sixteenth embodiment of the invention.

FIG. 22 is a cross sectional view of a semiconductor device according to a sixteenth embodiment of the invention. The semiconductor device shown in FIG. 22 is different from the semiconductor device shown in FIG. 21 in that first n-type buffer regions 23 are formed such that first n-type buffer regions 23 surround p-type base regions 3 and p-type bypass region 17 in FIG. 22. In FIG. 22, first n-type buffer region 23 is flat below p-type bypass region 17. The semiconductor device shown in FIG. 22 exhibits the same effects as those of the semiconductor device shown in FIG. 21. By forming a Schottky junction in the portion where p-type bypass region 17 is to be formed, the same effects as obtained by p-type bypass regions 17 are obtained.

Figure 23:
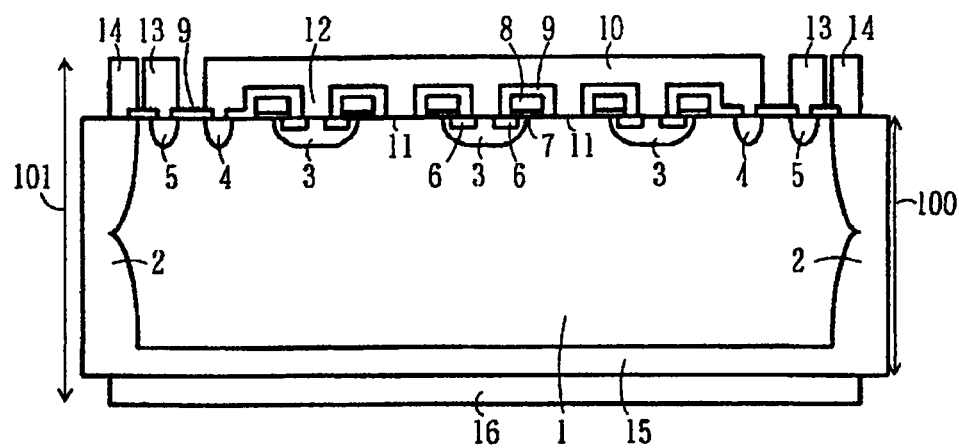
FIG. 23 is a cross sectional view of a semiconductor device according to a seventeenth embodiment of the invention.

FIG. 23 is a cross sectional view of a semiconductor device according to a seventeenth embodiment of the invention. In FIG. 23, p$^+$-type isolation region 2 in the scribing portion is formed by driving p$^+$-type regions from the upper and lower surfaces of semiconductor substrate 100 until p$^+$-type regions contact each other. It is more preferable to form the above described p$^+$-type isolation region 2 using Al or Ga, the diffusion coefficient thereof being larger than that of boron.

Figure 24:
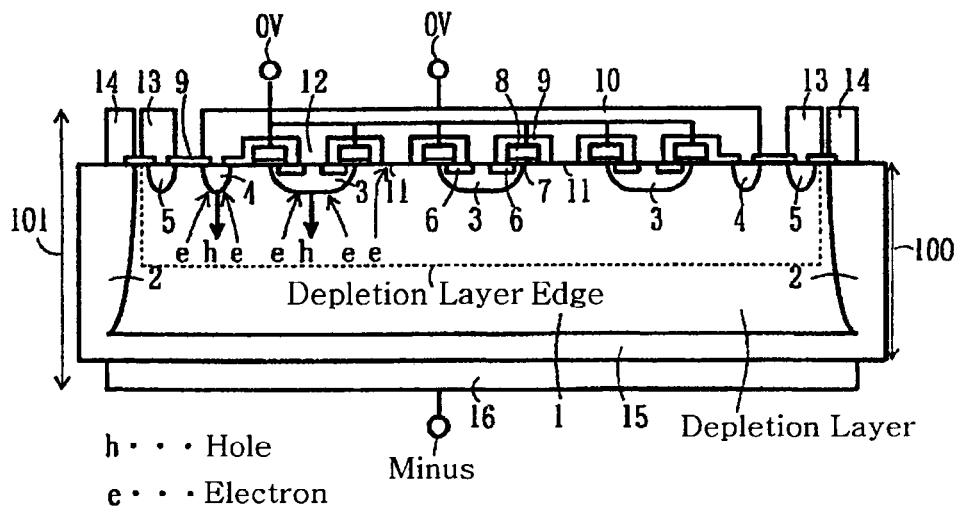
FIG. 24 is a cross sectional view in which a circuit connection for applying a reverse bias voltage is added to the cross sectional view of the semiconductor device shown in FIG. 1(b).

FIG. 24 is a cross sectional view in which a circuit connection for applying a reverse bias voltage is added to the cross sectional view of the semiconductor device shown in FIG. 1($b$). When the gate voltage is set at 0 V and a reverse bias voltage is applied which biases collector electrode 16 at a negative voltage and emitter electrode 10 at 0 V, a depletion layer expands from the pn-junction between p$^+$-type collector region 15 and n⁻-type drift region 1 into n⁻-type drift region 1 toward p-type base regions 3. In this process, electrons flow from a charge neutrality region, left undepleted in the portion of n⁻-type drift region 1 on the side of p-type base regions 3, to Schottky junctions 11 and the electron flow to p-type base regions 3 is suppressed. As a result, the emitter injection efficiency and α pnp (the current amplification factor of the pnp-transistor formed of p-type base regions (E), an n⁻-type drift region (B), and a p⁺-type collector region (C)) are lowered. Therefore, it becomes possible to suppress the leakage current that flows in the reverse blocking IGBT biased at a reverse bias potential to be 1 mA/cm² or lower especially at a high temperature of 100° or higher.

The dose amount in p-type region 4, formed below the gate runner portion (not shown) with an interlayer insulation film interposed therebetween and connected to emitter electrode 10, is $1 \times 10^{15}$ cm⁻². Since p-type region 4 doped more heavily than p-type base region 3, the dose amount thereof is $1 \times 10^{14}$ cm⁻², is connected to emitter electrode 10, the efficiency of injection through p-type region 4 becomes high and the leakage current caused in p-type region 4 becomes high. The countermeasures for obviating the above described problem will be described below.

Figure 25A:
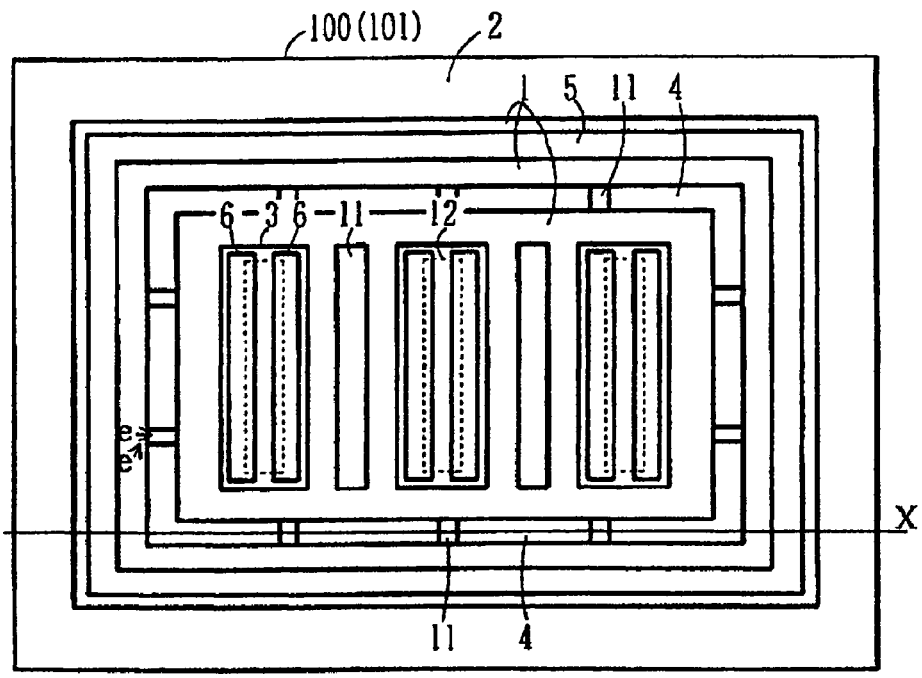
FIG. 25(a) is a top plan view of a semiconductor device according to an eighteenth embodiment of the invention.
Figure 25B:
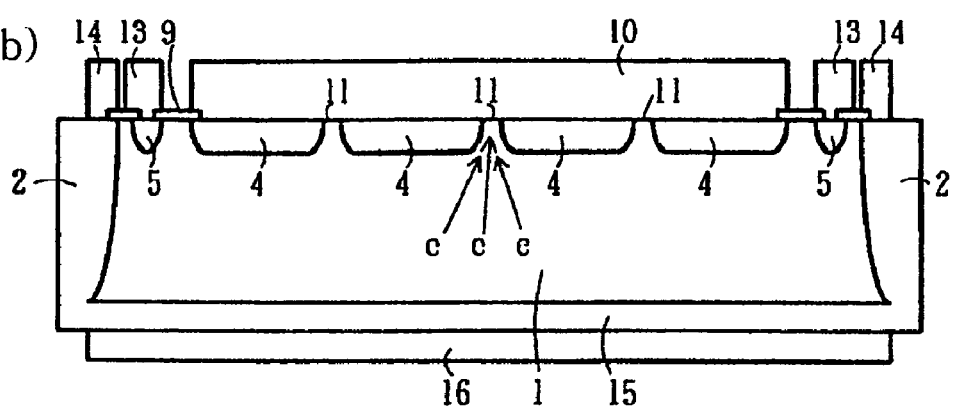
FIG. 25(b) is a cross sectional view of the semiconductor device according to the eighteenth embodiment along the line segment X-X of FIG. 25(a).

FIG. 25(a) is a top plan view of a semiconductor device according to an eighteenth embodiment of the invention. FIG. 25(b) is a cross sectional view of the semiconductor device according to the eighteenth embodiment along the line segment X-X of FIG. 25(a). The semiconductor device shown in FIGS. 25(a) and 25(b) is different from the semiconductor device shown in FIGS. 1(a) and 1(b) in that Schottky junctions 11 are formed selectively between p-type regions 4. By separating p-type regions 4 as described above, and by connecting the extended portions of n⁻-type drift region 1 that extend between p-type regions 4 and emitter electrode 10 to each other to form Schottky junctions 11, the electrons are extracted from Schottky junctions 11 and the efficiency of the hole injection from p-type regions 4 to n⁻-type drift region 1 is suppressed. Therefore, the leakage current caused in p-type regions 4 is reduced.

Figure 26:
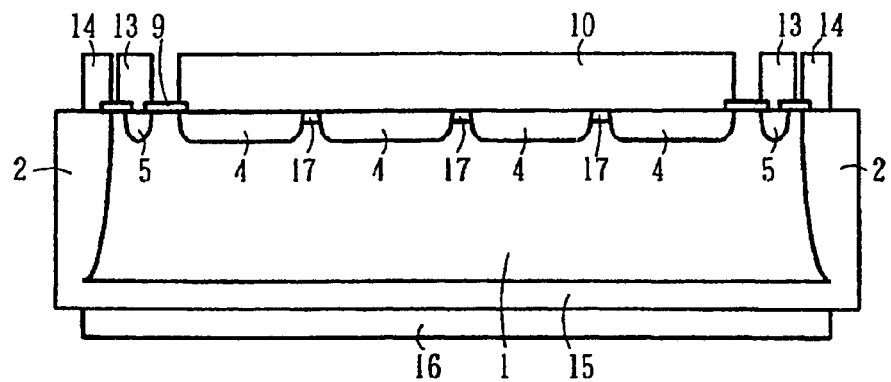
FIG. 26 is a cross sectional view of a semiconductor device according to a nineteenth embodiment of the invention.

FIG. 26 is a cross sectional view of a semiconductor device according to a nineteenth embodiment of the invention. The semiconductor device shown in FIG. 26 is different from the semiconductor device shown in FIG. 25(b) in that third p-type semiconductor regions 17 (hereinafter referred to as "p-type bypass regions 17") are formed in the extended portions of n⁻-type drift region 1 that extend between island-shaped p-type regions 4, where Schottky junctions 11 are to be formed in FIG. 25(b). The semiconductor device shown in FIG. 26 exhibits the same effects as those of the semiconductor device shown in FIG. 23.

Although the above described IGBTs secure a certain reverse breakdown voltage by p⁺-type separation region 2, the example that secures a certain reverse breakdown voltage by the other method will be described below.

Figure 27:
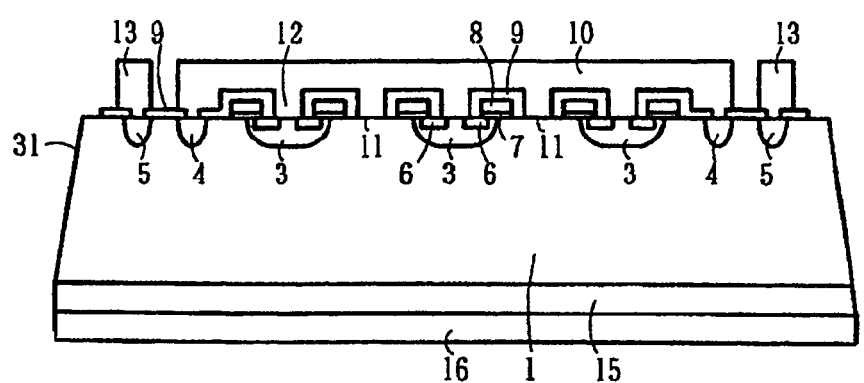
FIG. 27 is a cross sectional view of a semiconductor device according to a twentieth embodiment of the invention.

FIG. 27 is a cross sectional view of a semiconductor device according to a twentieth embodiment of the invention. The semiconductor device shown in FIG. 27 is different from the semiconductor device shown in FIG. 1(b) in that a bevel structure is formed by mesa etching. Mesa etching section 31 is formed according to the twentieth embodiment in the portion where p⁺-type separation region 2 is to be formed in FIG. 1(b). The semiconductor device shown in FIG. 27 secures a certain reverse breakdown voltage by the bevel structure.

Figure 28:
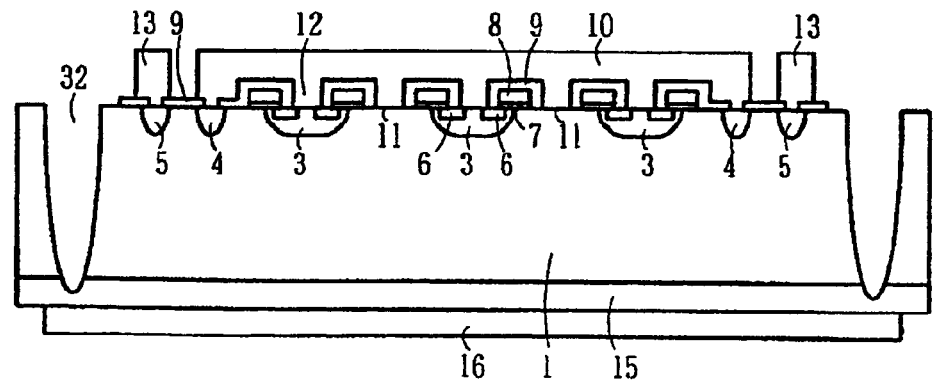
FIG. 28 is a cross sectional view of a semiconductor device according to a twenty-first embodiment of the invention.

FIG. 28 is a cross sectional view of a semiconductor device according to a twenty-first embodiment of the invention. The semiconductor device shown in FIG. 28 is different from the semiconductor device shown in FIG. 27 in that a bevel structure is formed by moat etching. Moat etching section 32 is formed by trench etching according to the twenty-first embodiment. The semiconductor device shown in FIG. 28 exhibits the same effects as those of the semiconductor device shown in FIG. 27. The same effects as obtained by employing the Schottky junction or by employing the p-type bypass region are obtained by combining the Schottky junction and the p-type bypass region.

Figure 29A:
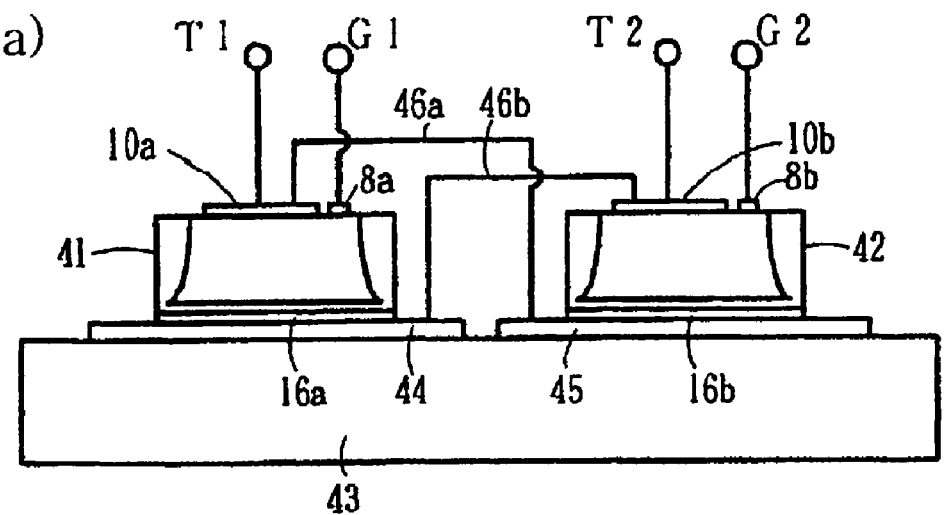
FIG. 29(a) is a cross sectional view of a two-way switching device according to a twenty-second embodiment of the invention.
Figure 29B:
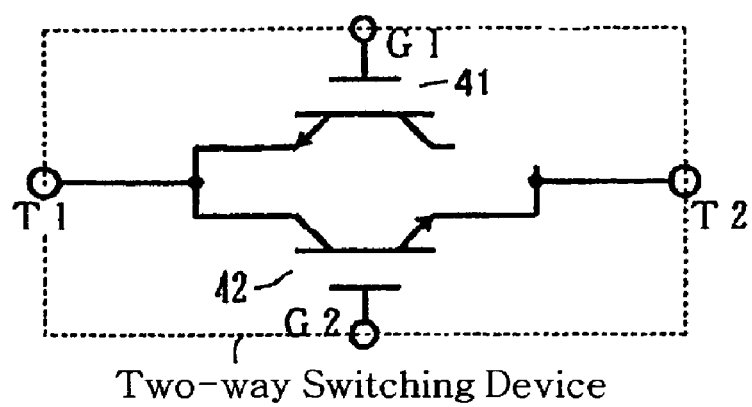
FIG. 29(b) is the circuit diagram of the two-way switching device shown in FIG. 29(a).

FIG. 29(a) is a cross sectional view of a two-way switching device according to a twenty-second embodiment of the invention. FIG. 29(b) is the circuit diagram of the two-way switching device shown in FIG. 29(a). Referring now to FIG. 29(a), the two-way switching device according to the twenty second embodiment includes insulator substrate 43; first conductor pattern 44 and second conductor pattern 45 on insulator substrate 43; first reverse blocking IGBT 41 including first collector electrode 16a fixed to first conductor pattern 44, first emitter electrode 10a, and gate pad 8a; second reverse blocking IGBT 42 including second collector electrode 16b fixed to second conductor pattern 45, second emitter electrode 10b, and gate pad 8b; bonding wire 46a connecting first emitter electrode 10a of first reverse blocking IGBT 41 and second conductor pattern 45 with each other; bonding wire 46b connecting second emitter electrode 10b of second reverse blocking IGBT 42 and first conductor pattern 44 with each other; first main terminal T1, to which first emitter electrode 10a of first reverse blocking IGBT 41 is connected; second main terminal T2, to which second emitter electrode 10b of second reverse blocking IGBT 42 is connected; first gate terminal G1, to which gate pad 8a of first reverse blocking IGBT 41 is connected; and second gate terminal G2, to which gate pad 8b of second reverse blocking IGBT 42 is connected. As shown in FIG. 29(b), the two-way switching device shown in FIG. 29(a) has a structure in which reverse blocking IGBTs 41 and 42 according to the invention are connected in opposite parallel to each other.

Figure 30:
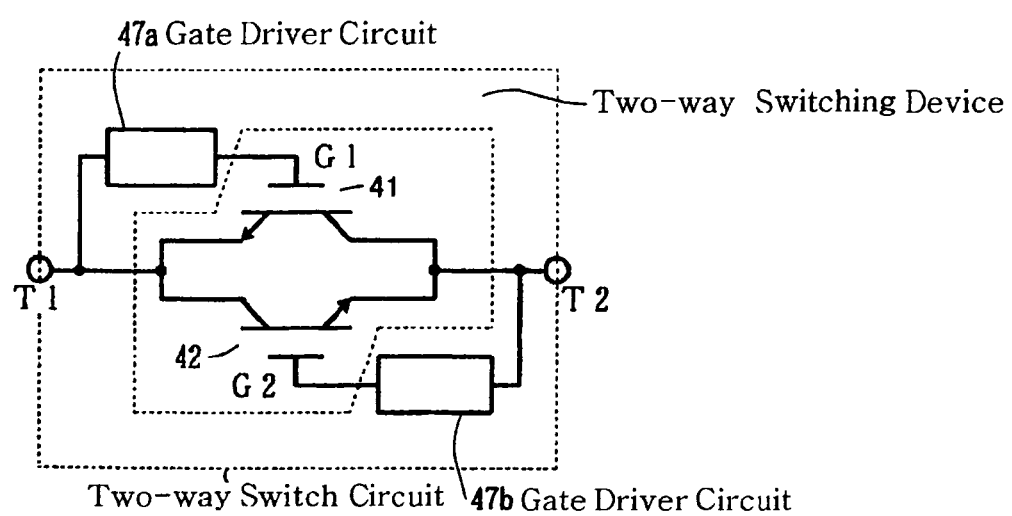
FIG. 30 is a circuit diagram of a two-way switch circuit including the two-way switching device shown in FIGS. 29(a) and 29(b).
Figures 31A, 31B:
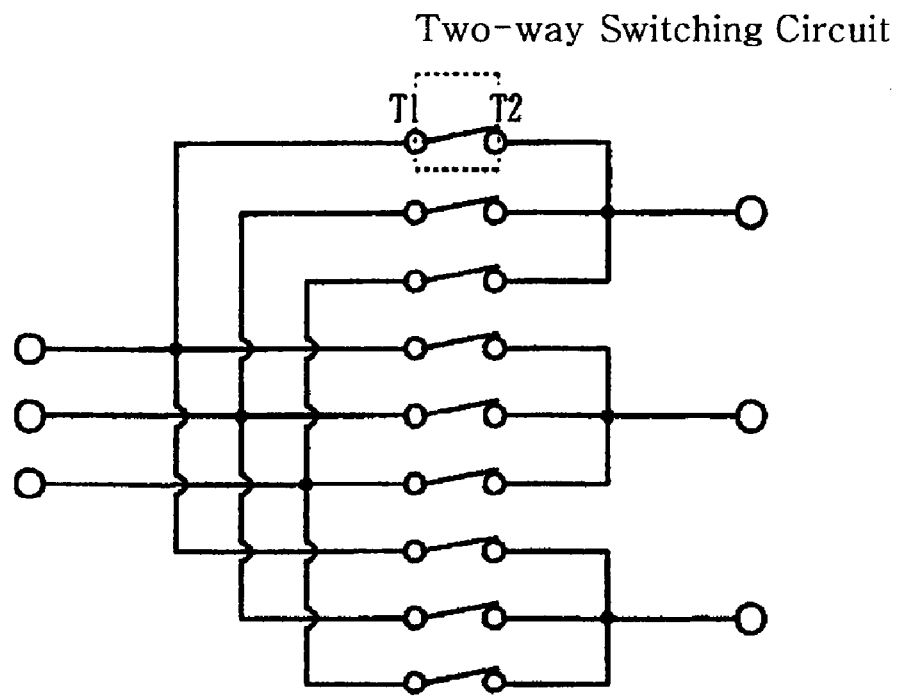
FIG. 31(a) is a circuit diagram of a matrix converter.
FIG. 31(b) is a diagram of a two-way switch circuit including conventional two-way switching devices.

FIG. 30 is a circuit diagram of a two-way switch circuit including the two-way switching device shown in FIGS. 29(a) and 29(b). Referring now to FIG. 30, the two-way switch circuit is constructed by connecting first gate driver circuit 47a to first reverse blocking IGBT 41 and second gate driver circuit 47b to second reverse blocking IGBT 41. The two-way switch circuit constructed as described above does not need any reverse blocking diode and facilitates reducing the electrical loses (such as the forward voltage drops and the reverse recovery loses).

Therefore, by using the reverse blocking IGBTs according to the invention, the leakage current caused by reverse bias voltage application is reduced greatly and a matrix converter with low losses is obtained.

According to the invention, the extended surface portions of the n⁻-type drift region and the emitter electrode are in Schottky contact to form Schottky junctions, or thin p-type bypass regions formed in the surface portions of the n⁻-type drift region and the emitter electrode are in contact. The reverse blocking IGBT having any of the above described structures greatly reduces the leakage current caused by reverse bias voltage application (the reverse leakage current).

Since the amplification effects of the parasitic bipolar transistors are suppressed without applying a positive bias voltage to the gate electrode as done in the prior art. The breakdown of the semiconductor device caused by the increase of the reverse leakage current is prevented from occurring without conducting any complicated gate control.

By forming Schottky junctions or p-type bypass regions in the surface portions of the p-type region for extracting carriers, the reverse leakage current is reduced. Since the reverse leakage current of the conventional reverse blocking IGBT is high at a high temperature, the conventional reverse blocking IGBT may thermally run away by the heat generated therein. In contrast, the reverse blocking IGBTs according to the invention can be used in high-temperature environments. By forming Schottky junctions or p-type bypass regions in the extended portions of the n⁻-type drift region extended to the surface of the semiconductor substrate, both the reverse leakage current and the on-voltage are reduced.

Thus, an improved semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A method of manufacturing the semiconductor device including a semiconductor substrate, an n-type drift region in the semiconductor substrate, p-type base regions formed selectively in the surface portion of the drift region, one or more n-type emitter regions in the surface portion of each of the base regions, a gate electrode over a part of each of the base regions and a part of the one or more emitter regions, with a gate insulation film interposed beneath the gate electrode, an emitter electrode in contact with the base regions and the emitter regions, second p-type semiconductor regions in the surface portion of the drift region, the second p-type semiconductor regions being shaped as islands arranged as a ring surrounding the base regions, a p-type collector region on the back surface of the drift region, a p-type separation region in contact with the side faces of the collector region and the side faces of the drift region, and a collector electrode on the collector region, the method comprising:

extending the drift region between the base regions;
   implanting boron ions at a dose amount between $1\times10^{11}$ cm$^{-2}$ and $1\times10^{14}$ cm$^{-2}$ into portions of the drift region that extend between the base regions to form first p-type semiconductor regions and into portions of the drift region that extend between the island-shaped second p-type semiconductor regions, thereby forming third p-type semiconductor regions;
   making the first p-type semiconductor regions and the emitter electrode contact each other; and
   making the second p-type semiconductor regions and the third p-type semiconductor regions contact the peripheral portion of the emitter electrode simultaneously with making the first p-type semiconductor regions and the emitter electrode contact each other.

2. The method according to claim 1, wherein a heat treatment is conducted at 550° or lower, to form the first p-type semiconductor regions.

* * * * *